(12) United States Patent
Chung et al.

(10) Patent No.: US 10,164,053 B1
(45) Date of Patent: Dec. 25, 2018

(54) SEMICONDUCTOR DEVICE AND METHOD

(71) Applicant: Taiwan Semiconductor Manufacturing Company, Ltd., Hsinchu (TW)

(72) Inventors: Che-Liang Chung, Taoyuan (TW); Chi-Te Huang, Taoyuan (TW); Shich-Chang Suen, Hsinchu (TW); Kei-Wei Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/692,871

(22) Filed: Aug. 31, 2017

(51) Int. Cl.
| | |
|---|---|
| *H01L 29/66* | (2006.01) |
| *H01L 21/311* | (2006.01) |
| *H01L 29/417* | (2006.01) |
| *H01L 21/8238* | (2006.01) |
| *H01L 29/78* | (2006.01) |

(52) U.S. Cl.
CPC .... *H01L 29/6656* (2013.01); *H01L 21/31144* (2013.01); *H01L 29/41725* (2013.01); *H01L 29/66545* (2013.01); *H01L 29/66795* (2013.01); *H01L 21/823821* (2013.01); *H01L 29/785* (2013.01)

(58) Field of Classification Search
CPC ....................................................... H01L 29/66
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,466,564 | B1 | 10/2016 | Liou et al. |
| 9,520,482 | B1 | 12/2016 | Chang et al. |
| 9,576,814 | B2 | 2/2017 | Wu et al. |
| 2014/0374805 | A1 | 12/2014 | Wu et al. |
| 2017/0154972 | A1 | 6/2017 | Hsieh et al. |
| 2017/0170300 | A1 | 6/2017 | Chang et al. |
| 2017/0179120 | A1 | 6/2017 | Cheng et al. |

FOREIGN PATENT DOCUMENTS

| | | |
|---|---|---|
| TW | 201635536 A | 10/2016 |
| TW | 201724281 A | 7/2017 |
| TW | 201724523 A | 7/2017 |
| TW | 201729266 A | 8/2017 |

*Primary Examiner* — Marvin Payen
(74) *Attorney, Agent, or Firm* — Slater Matsil, LLP

(57) ABSTRACT

In an embodiment, a method includes: forming a gate stack on a semiconductor fin, the gate stack having gate spacers along opposing sides of the gate stack; forming source/drain regions adjacent the gate stack; recessing the gate stack to form a first recess between the gate spacers; depositing a dielectric layer over the gate stack in the first recess; forming a first metal mask over the dielectric layer and the gate stack in the first recess; etching back the dielectric layer and the gate spacers to form a dielectric mask under the first metal mask; depositing a conductive material over the first metal mask and adjacent the gate stack; and planarizing the conductive material to form contacts electrically connected to the source/drain regions, top surfaces of the contacts and the dielectric mask being level.

20 Claims, 27 Drawing Sheets

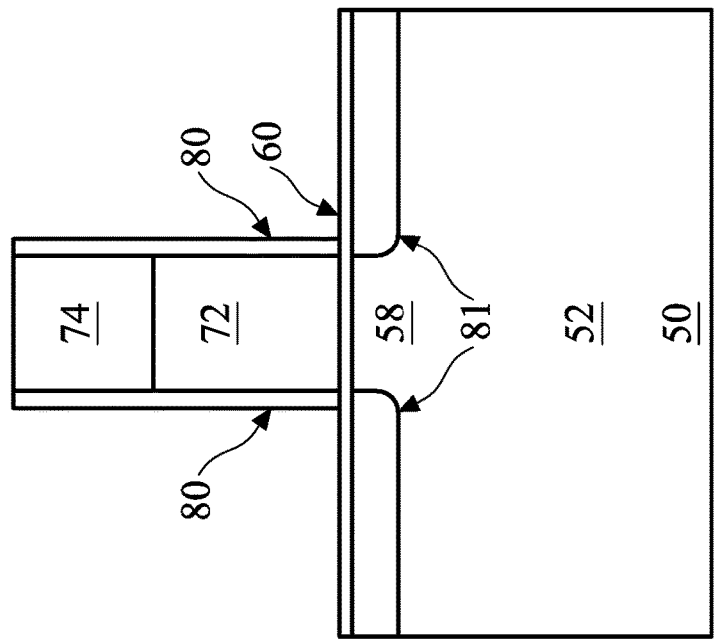
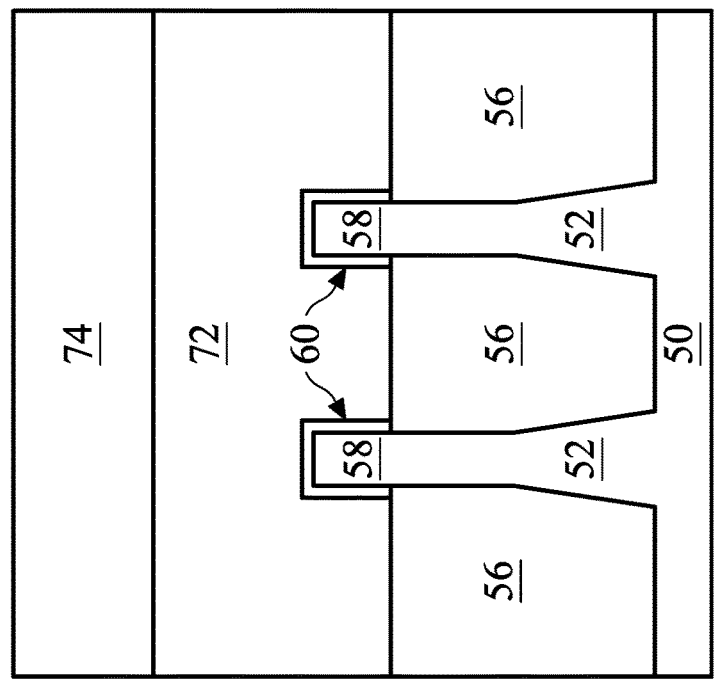
FIG. 8B
FIG. 8A

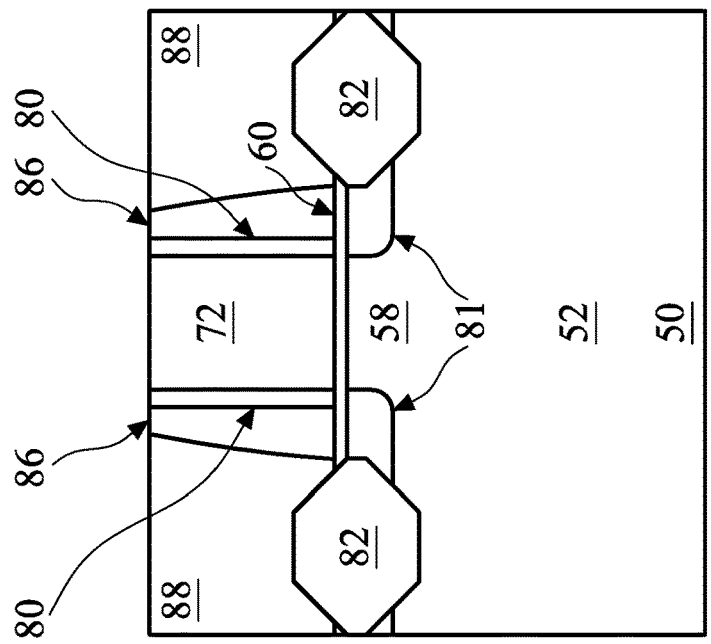
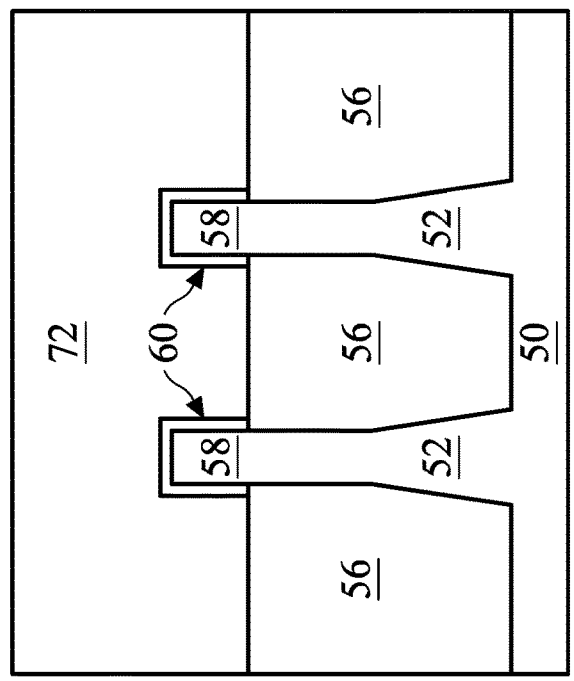
FIG. 12B
FIG. 12A

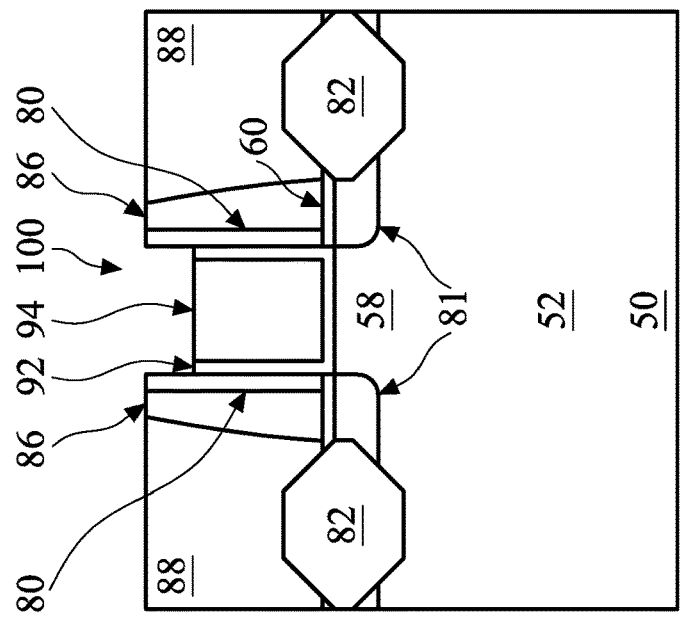
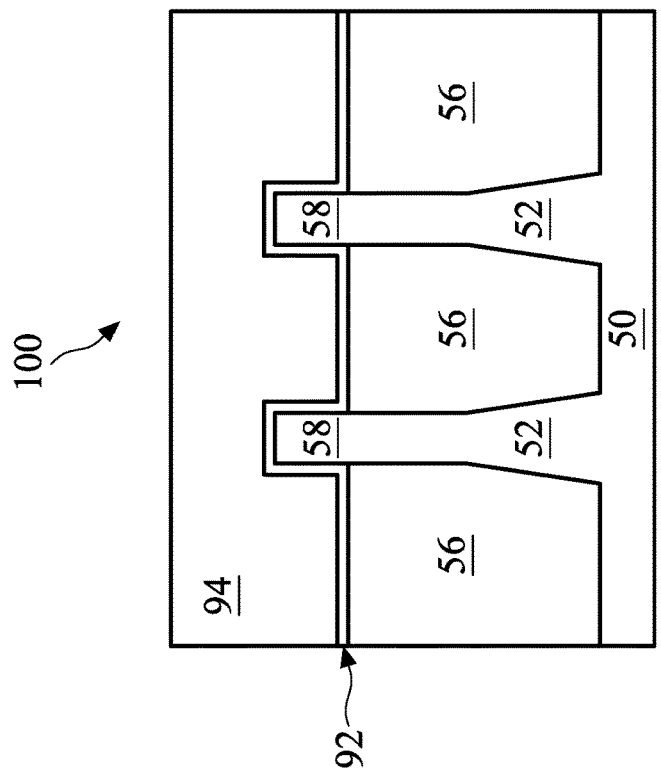
FIG. 15B
FIG. 15A

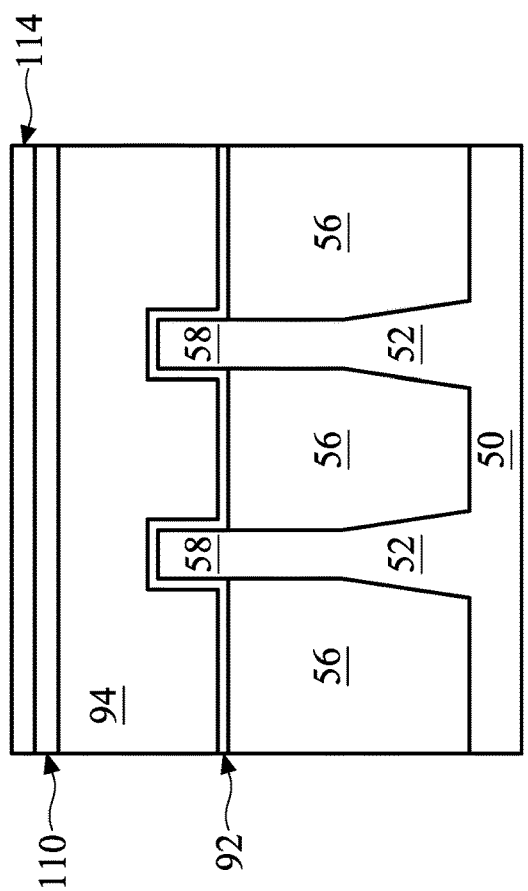
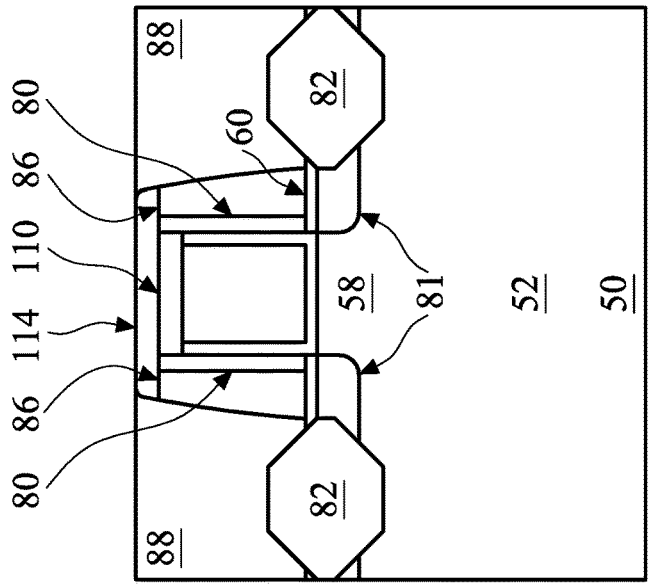
FIG. 21A
FIG. 21B

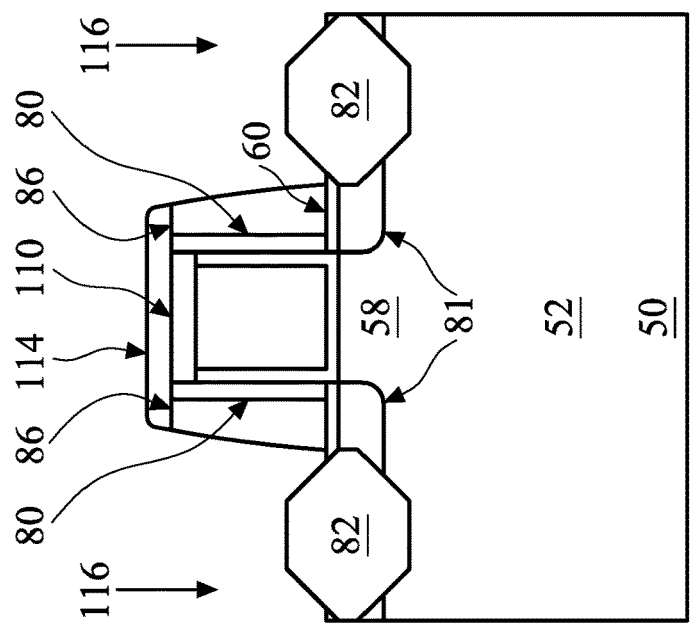
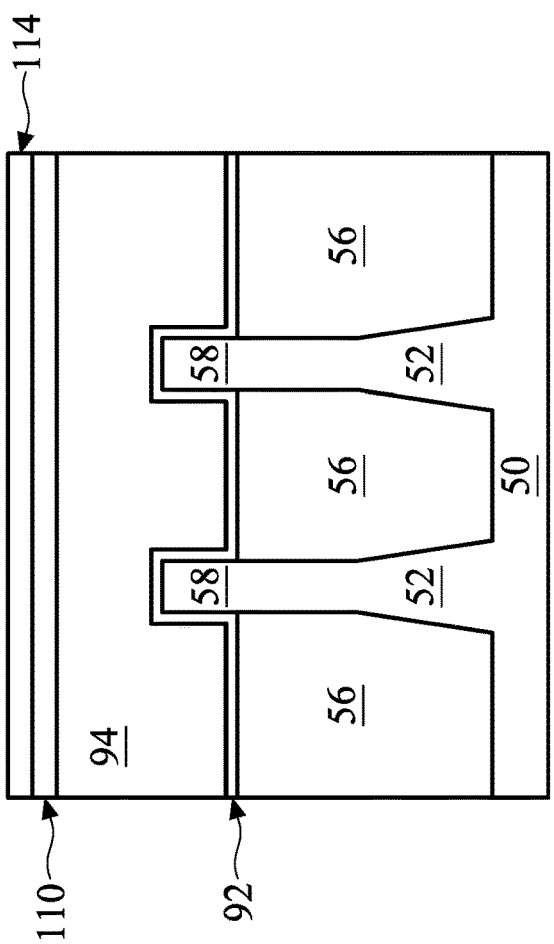
FIG. 22B
FIG. 22A

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 26B are cross-sectional views of intermediate stages in the manufacturing of FinFETs, in accordance with some embodiments.

DETAILED DESCRIPTION

Figure 1:
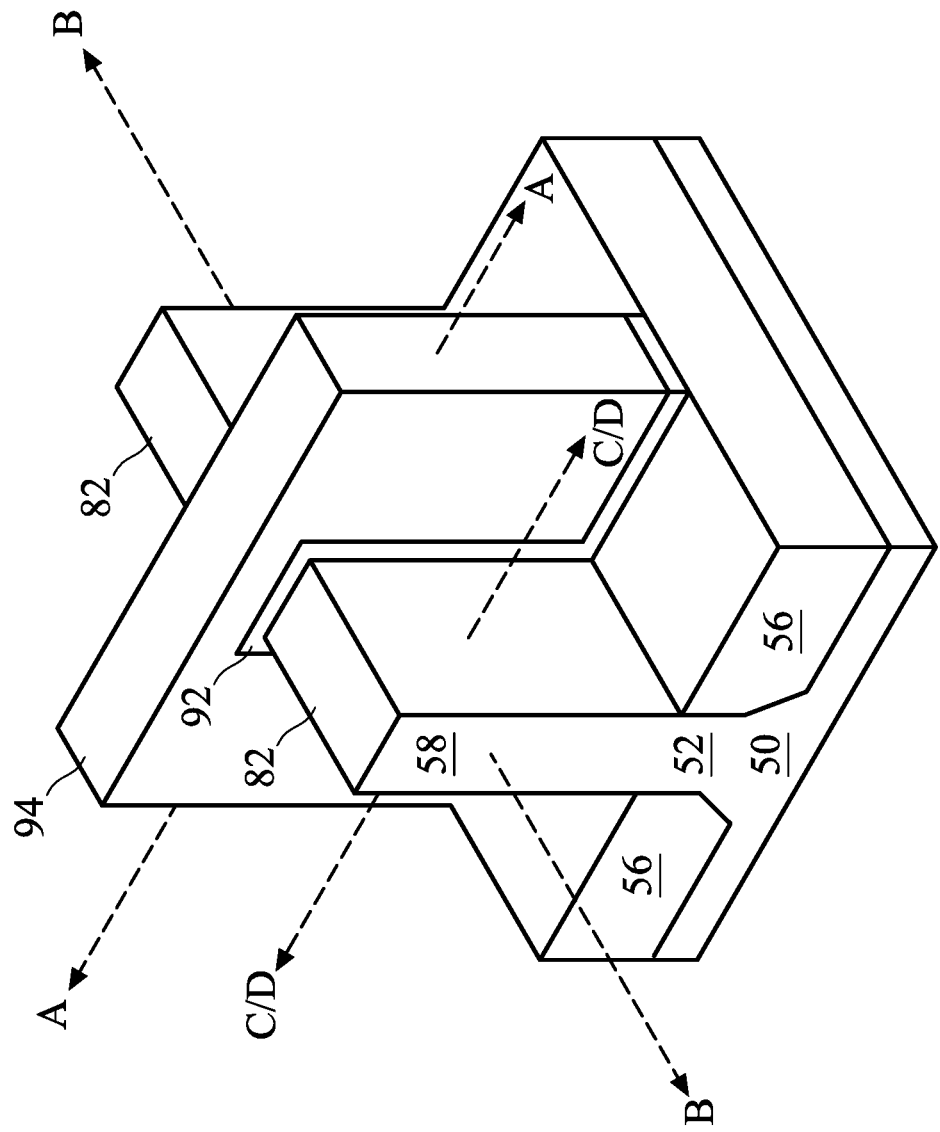
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a gate stack is formed on a semiconductor fin, and spacers are formed for the gate stack. A bi-layer film, which includes a metal layer and a dielectric layer, are formed over the gate stack and spacers. The metal layer and dielectric layer are patterned in subsequent processes, and the patterned layers are used for etch stop and planarization stop layers in the subsequent processes. As a result, the height of the gate stack and spacers may be defined by a single etching step, and loss of the gate stack and spacer height in subsequently performed etching and planarization steps may be avoided.

FIG. 1 illustrates an example of a FinFET in a three-dimensional view, in accordance with some embodiments. The FinFET comprises a fin 58 on a substrate 50. Isolation regions 56 are formed on the substrate 50, and the fin 58 protrudes above and from between neighboring isolation regions 56. A gate dielectric layer 92 is along sidewalls and over a top surface of the fin 58, and a gate electrode 94 is over the gate dielectric layer 92. Source/drain regions 82 are disposed in opposite sides of the fin 58 with respect to the gate dielectric layer 92 and gate electrode 94. FIG. 1 further illustrates reference cross-sections that are used in later figures. Cross-section A-A is across a channel, gate dielectric layer 92, and gate electrode 94 of the FinFET. Cross-section B-B is perpendicular to cross-section A-A and is along a longitudinal axis of the fin 58 and in a direction of, for example, a current flow between the source/drain regions 82. Cross-section C-C is parallel to cross-section B-B and extends through a source/drain region of the FinFET Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 26B are cross-sectional views of intermediate stages in the manufacturing of FinFETs, in accordance with some embodiments. FIGS. 2 through 6 illustrate reference cross-section A-A illustrated in FIG. 1, except for multiple fins/FinFETs. In FIGS. 7A through 26B, figures ending with an "A" designation are illustrated along reference cross-section A-A illustrated in FIG. 1, and figures ending with a "B" designation are illustrated along a similar cross-section B-B illustrated in FIG. 1, except for multiple fins/FinFETs. FIGS. 10C and 10D are illustrated along reference cross-section C/D-C/D illustrated in FIG. 1, except for multiple fins/FinFETs.

Figure 2:
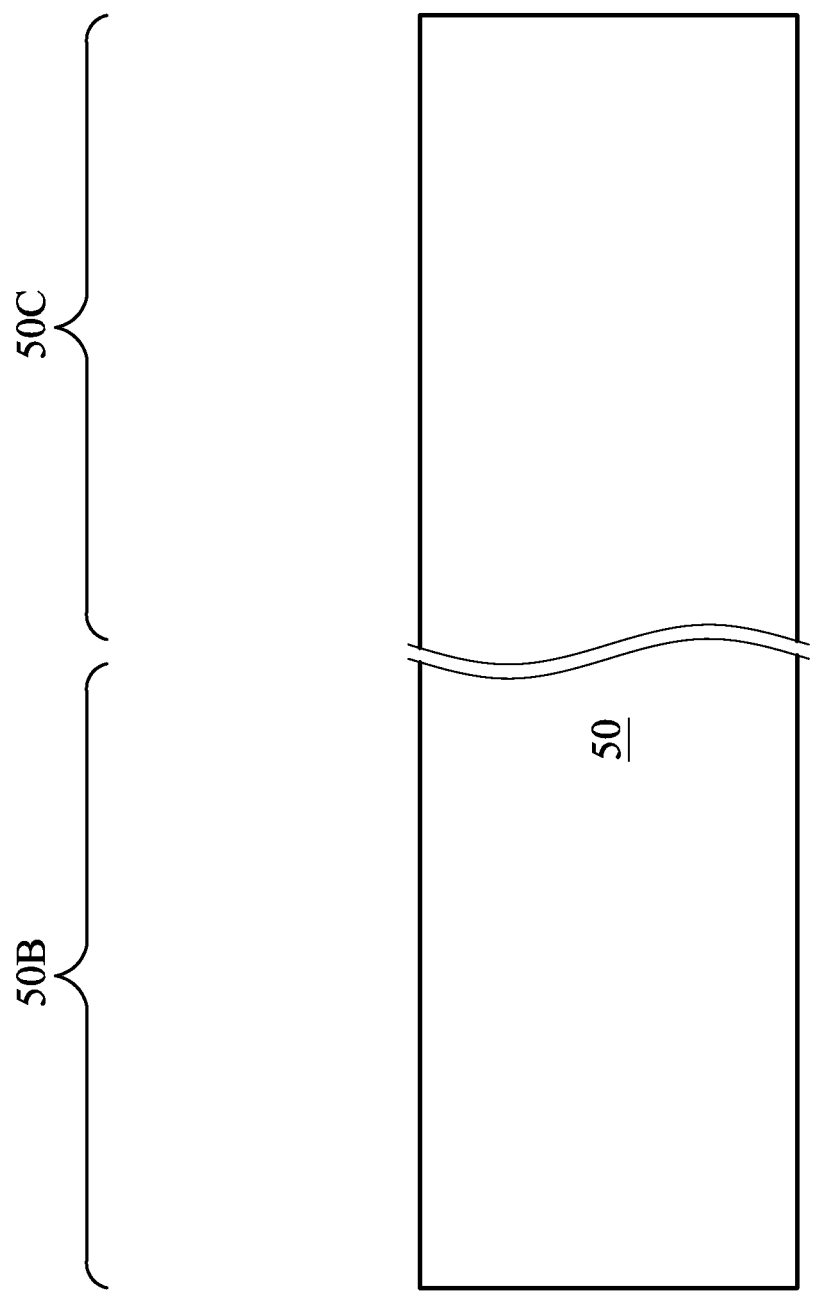

In FIG. 2, a substrate 50 is provided to form the wafers. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50B and a region 50C. The region 50B can be for forming n-type devices, such as NMOS transistors, e.g., n-type FinFETs. The region 50C can be for forming p-type devices, such as PMOS transistors, e.g., p-type FinFETs. The region 50B may be physically separated from the region 50C (as illustrated by a divider), and any number of device features (e.g., other active devices, doped regions, isolation structures, etc.) may be disposed between the region 50B and the region 50C. In some embodiments, both the region 50B and the region 50C are used to form the same type of devices, such as both regions being for n-type devices or p-type devices.

Figure 3:
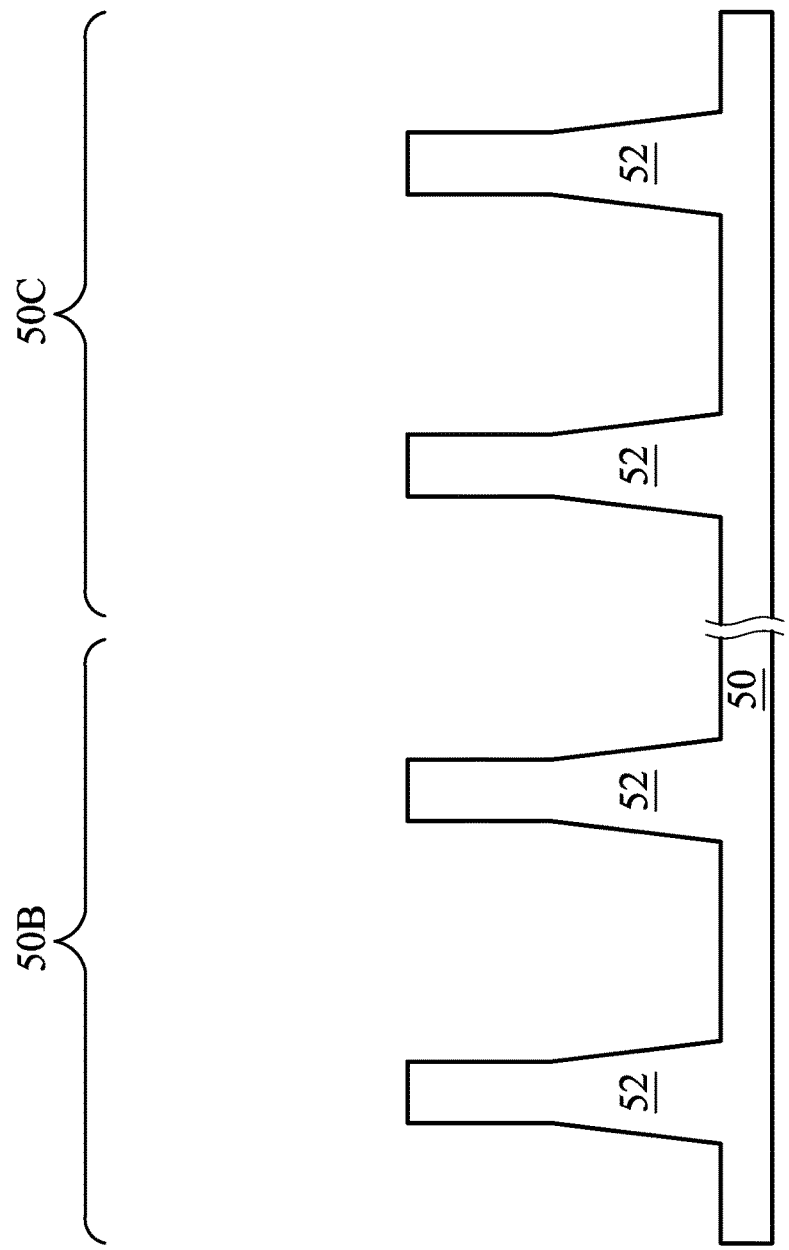

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

Figure 4:
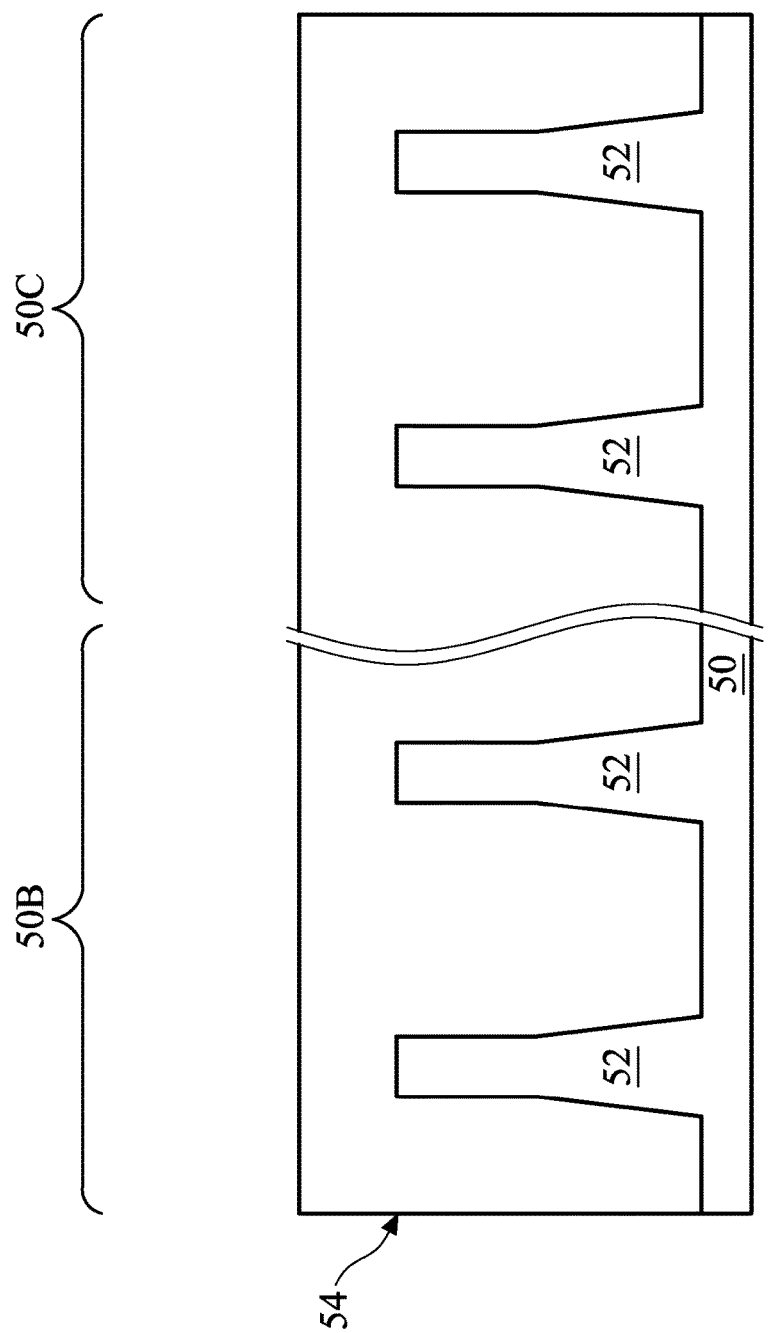

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52.

Figure 5:
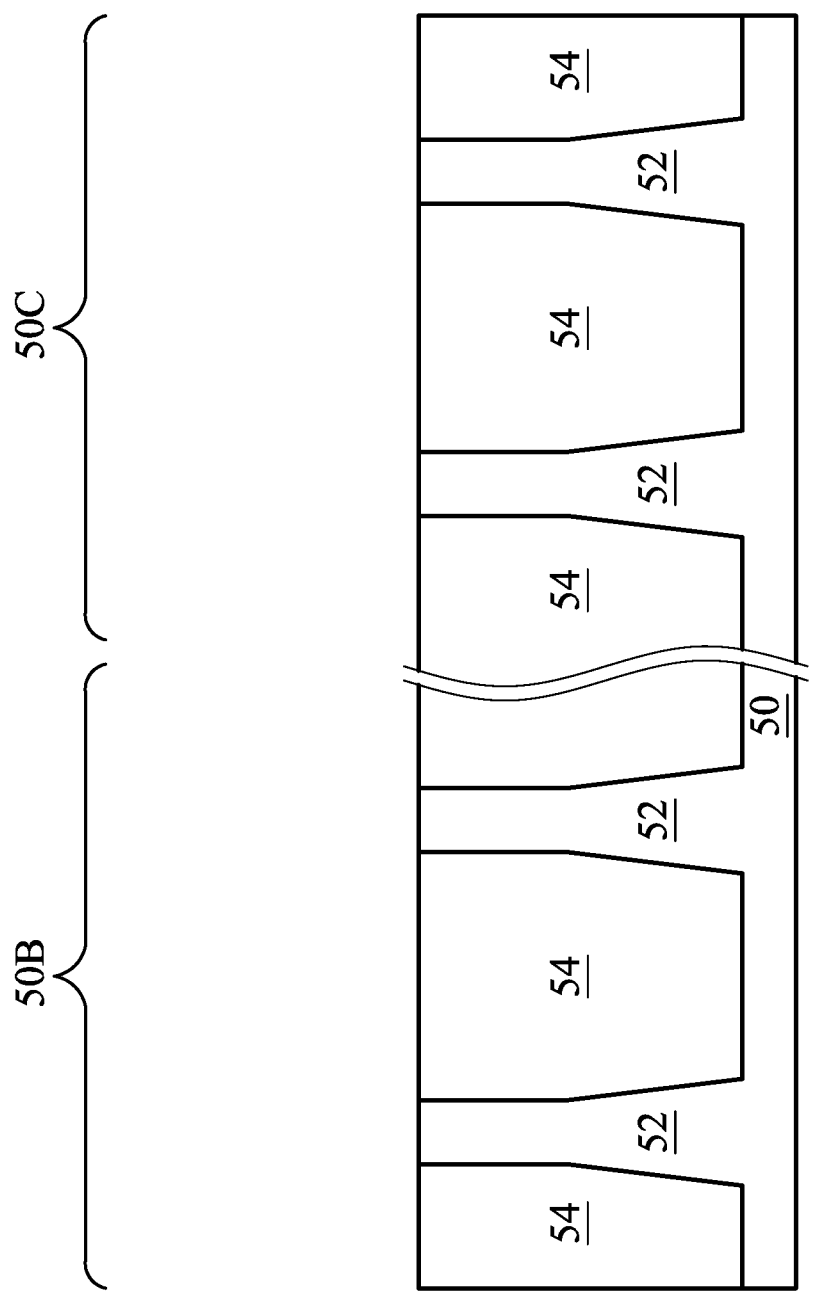

In FIG. 5, a planarization process is applied to the insulation material 54. In some embodiments, the planarization process includes a chemical mechanical polish (CMP), an etch back process, combinations thereof, or the like. The planarization process exposes the fins 52. Top surfaces of the fins 52 and the insulation material 54 are level after the planarization process is complete.

Figure 6:
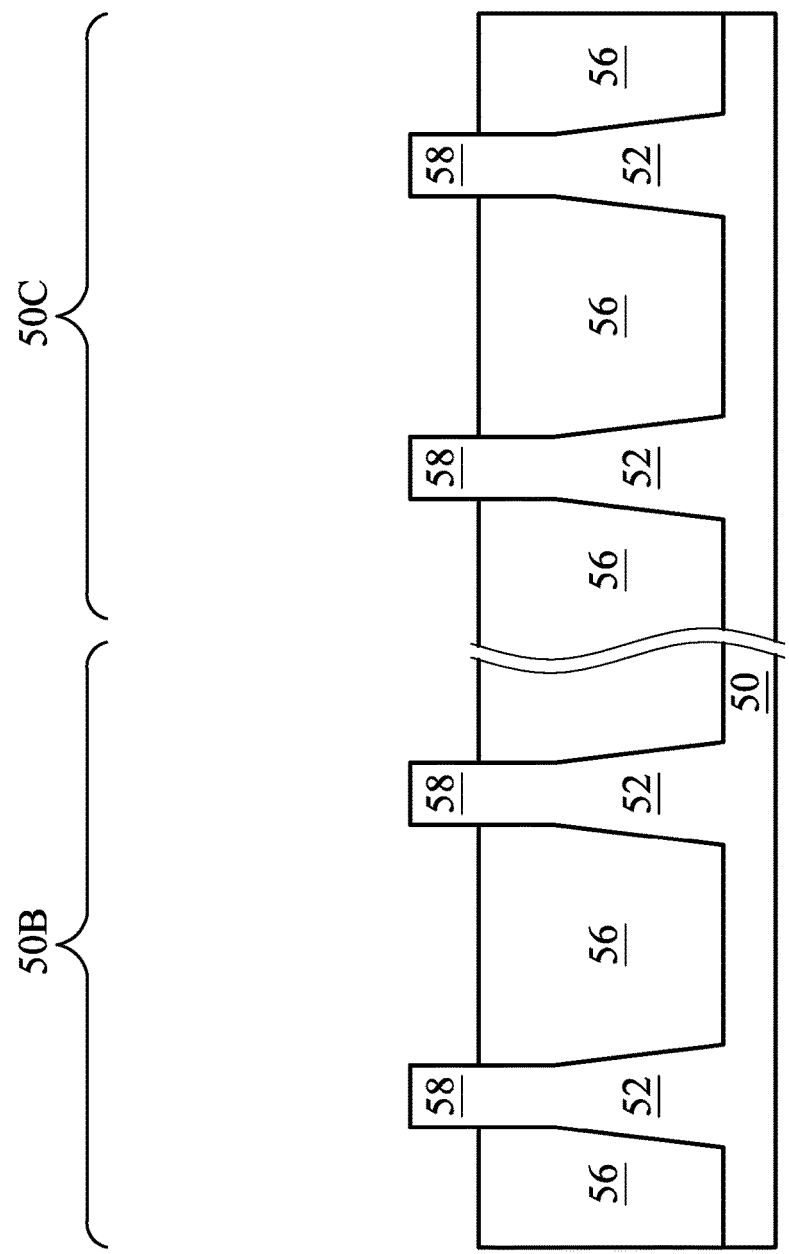

In FIG. 6, the insulation material 54 is recessed to form Shallow Trench Isolation (STI) regions 56. The insulation material 54 is recessed such that fins 58 in the region 50B and in the region 50C protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 6 is just one example of how the fins 58 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 52. For example, the fins 52 in FIG. 5 can be recessed, and a material different from the fins 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 58. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 58 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 58, the fins 52, and/or the substrate 50. In some embodiments, a P well may be formed in the region 50B, and an N well may be formed in the region 50C. In some embodiments, a P well or an N well are formed in both the region 50B and the region 50C.

In the embodiments with different well types, the different implant steps for the region 50B and the region 50C may be achieved using a photoresist or other masks (not shown). For example, a photoresist may be formed over the fins 58 and the STI regions 56 in the region 50B. The photoresist is patterned to expose the region 50C of the substrate 50, such as a PMOS region. The photoresist can be formed by using a spin-on technique and can be patterned using acceptable photolithography techniques. Once the photoresist is patterned, an n-type impurity implant is performed in the region 50C, and the photoresist may act as a mask to substantially prevent n-type impurities from being implanted into the region 50B, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50C, a photoresist is formed over the fins 58 and the STI regions 56 in the region 50C. The photoresist is patterned to expose the region 50B of the substrate 50, such as the NMOS region. The photoresist can be formed by using a spin-on technique and can be patterned using acceptable photolithography techniques. Once the photoresist is patterned, a p-type impurity implant may be performed in the region 50B, and the photoresist may act as a mask to substantially prevent p-type impurities from being implanted into the region 50C, such as the PMOS region. The p-type impurities may be boron, BF2, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50B and the region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

FIGS. 7A through 26B illustrate various additional steps in the manufacturing of embodiment devices. FIGS. 7A through 26B illustrate features in either of the region 50B or the region 50C. For example, the structures illustrated in FIGS. 7A through 26B may be applicable to both the region 50B and the region 50C. Differences (if any) in the structures of the region 50B and the region 50C are described in the text accompanying each figure.

Figure 7A:
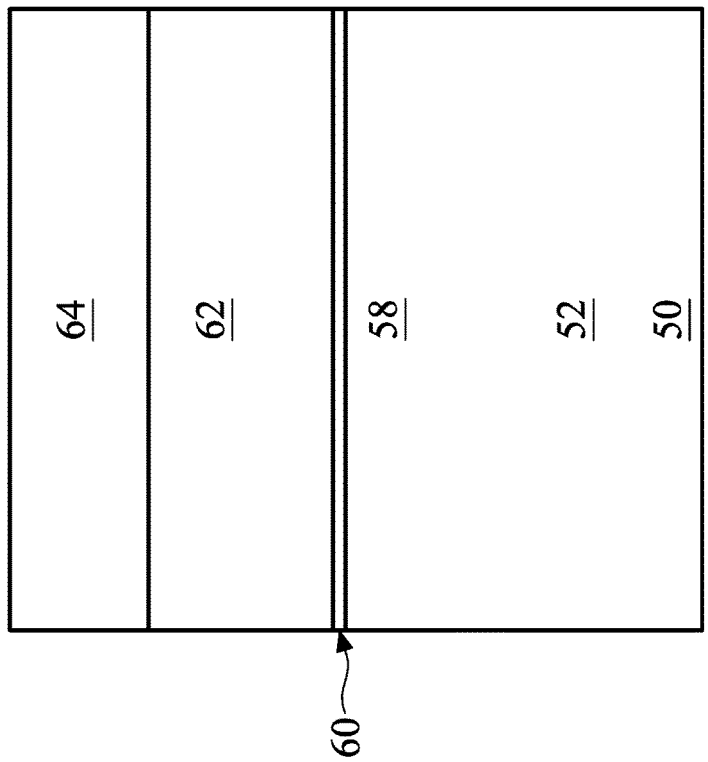
Figure 7B:
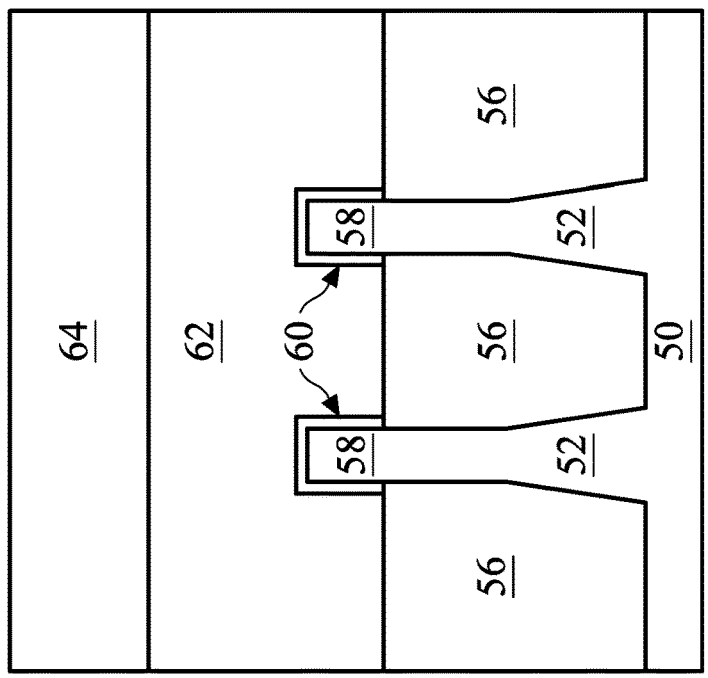

In FIGS. 7A and 7B, a dummy dielectric layer 60 is formed on the fins 58. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may be deposited over the dummy gate layer 62. The mask layer 64 may include, for example, SiN, SiON, or the like. In this example, a single dummy gate layer 62 and a single mask layer 64 are formed across the region 50B and the region 50C. In some embodiments, separate dummy gate layers may be formed in the region 50B and the region 50C, and separate mask layers may be formed in the region 50B and the region 50C.

In FIGS. 8A and 8B, the mask layer 64 may be patterned using acceptable photolithography and etching techniques to form masks 74. The pattern of the masks 74 then may be transferred to the dummy gate layer 62 and the dummy dielectric layer 60 by an acceptable etching technique to form dummy gates 72. The dummy gates 72 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective epitaxial fins.

Further in FIGS. 8A and 8B, gate seal spacers 80 can be formed on exposed surfaces of the dummy gates 72, the masks 74, and/or the fins 58. A thermal oxidation or a deposition followed by an anisotropic etch may form the gate seal spacers 80.

After the formation of the gate seal spacers 80, implants for lightly doped source/drain (LDD) regions 81 may be performed. In the embodiments with different device types, similar to the implants discussed above in FIG. 6, a mask, such as a photoresist, may be formed over the region 50B, while exposing the region 50C, and appropriate type (e.g., n-type or p-type) impurities may be implanted into the exposed fins 58 in the region 50C. The mask may then be removed. Subsequently, a mask, such as a photoresist, may be formed over the region 50C while exposing the region 50B, and appropriate type impurities may be implanted into the exposed fins 58 in the region 50B. The mask may then be removed. The n-type impurities may be the any of the n-type impurities previously discussed, and the p-type impurities may be the any of the p-type impurities previously discussed. The LDD regions 81 may have a concentration of impurities of from about $10^{15}$ cm$^{-3}$ to about $10^{16}$ cm$^{-3}$. An anneal may be used to activate the implanted impurities.

Figure 9A:
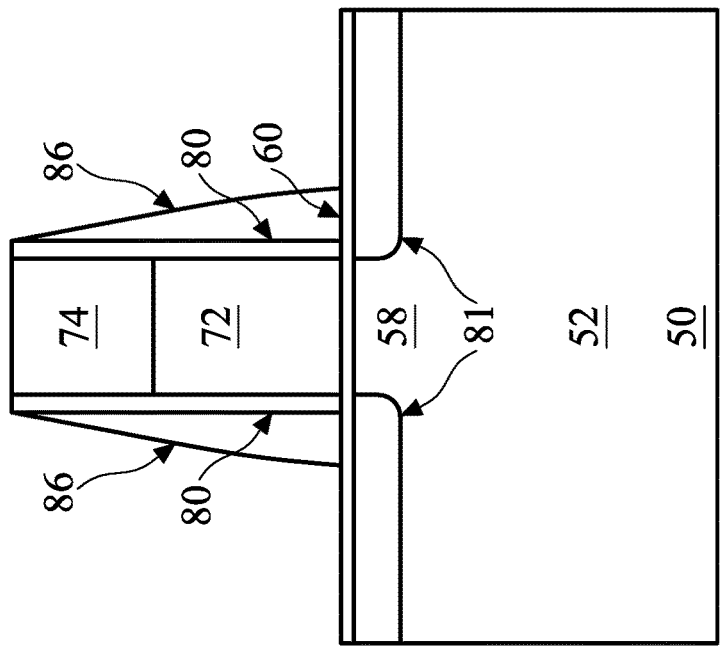
Figure 9B:
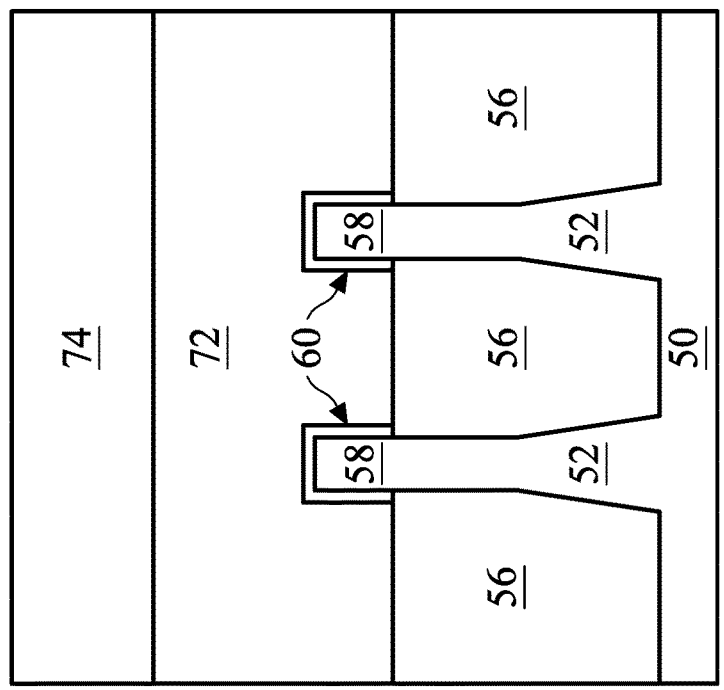

In FIGS. 9A and 9B, gate spacers 86 are formed on the gate seal spacers 80 along sidewalls of the dummy gates 72 and the masks 74. The gate spacers 86 may be formed by conformally depositing a material and subsequently anisotropically etching the material. The material of the gate spacers 86 may be silicon nitride, SiCN, a combination thereof, or the like. The etch may be selective to the material of the gate spacers 86, such that the epitaxial source/drain regions 82 are not etched during the formation of the gate spacers 86.

Figure 10B:
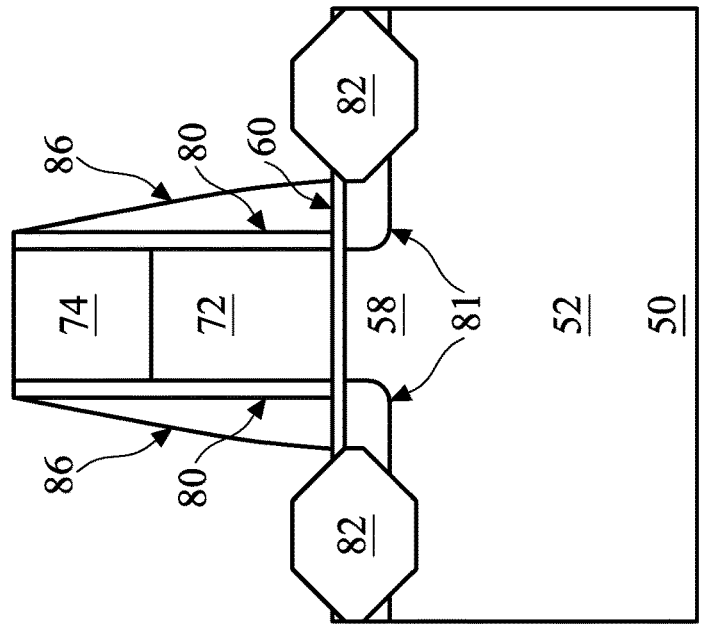
Figure 10A:
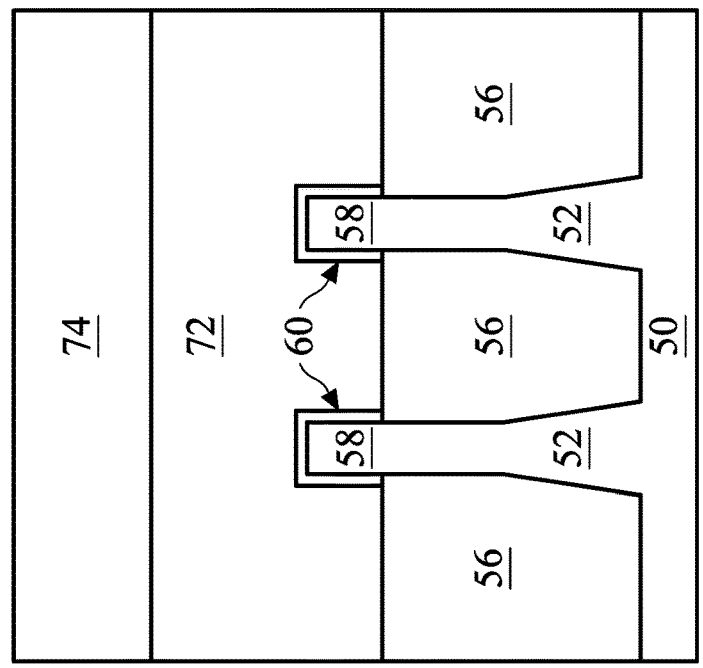
Figure 10C:
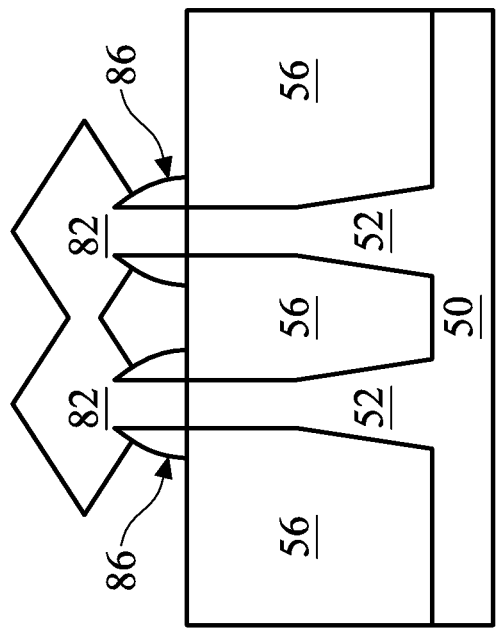
Figure 10D:
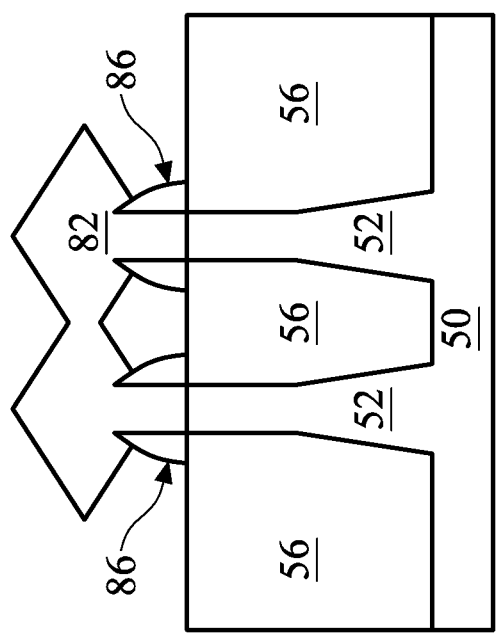

In FIGS. 10A and 10B, epitaxial source/drain regions 82 are formed in the fins 58. The epitaxial source/drain regions 82 are formed in the fins 58 such that each dummy gate 72 is disposed between respective neighboring pairs of the epitaxial source/drain regions 82. In some embodiments, the epitaxial source/drain regions 82 may extend through the LDD regions 81 and/or into the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50B, e.g., the NMOS region, may be formed by masking the region 50C, e.g., the PMOS region, and etching source/drain regions of the fins 58 in the region 50B to form recesses in the fins 58. Then, the epitaxial source/drain regions 82 in the region 50B are epitaxially grown in the recesses. The epitaxial source/drain regions 82 may include any acceptable material, such as appropriate for n-type FinFETs. For example, if the fins 58 are silicon, the epitaxial source/drain regions 82 in the region 50B may include silicon, SiC, SiCP, SiP, or the like. The epitaxial source/drain regions 82 in the region 50B may have surfaces raised from respective surfaces of the fins 58 and may have facets.

The epitaxial source/drain regions 82 in the region 50C, e.g., the PMOS region, may be formed by masking the region 50B, e.g., the NMOS region, and etching source/drain regions of the fins 58 in the region 50C to form recesses in the fins 58. Then, the epitaxial source/drain regions 82 in the region 50C are epitaxially grown in the recesses. The epitaxial source/drain regions 82 may include any acceptable material, such as appropriate for p-type FinFETs. For example, if the fins 58 are silicon, the epitaxial source/drain regions 82 in the region 50C may comprise SiGe, SiGeB, Ge, GeSn, or the like. The epitaxial source/drain regions 82 in the region 50C may also have surfaces raised from respective surfaces of the fins 58 and may have facets.

The epitaxial source/drain regions 82 and/or the fins 58 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50B and the region 50C, upper surfaces of the epitaxial source/drain regions have facets which expand laterally outward beyond a sidewalls of the fins 58. In some embodiments, these facets cause adjacent epitaxial source/drain regions 82 of a same finFET to merge as illustrated by FIG. 10C. In other embodiments, adjacent epitaxial source/drain regions 82 remain separated after the epitaxy process is completed as illustrated by FIG. 10D.

Figure 11B:
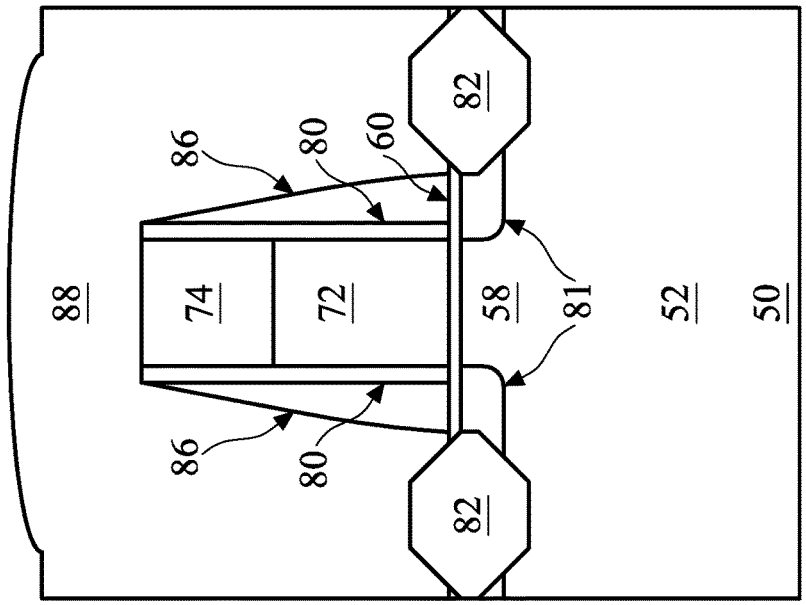
Figure 11A:
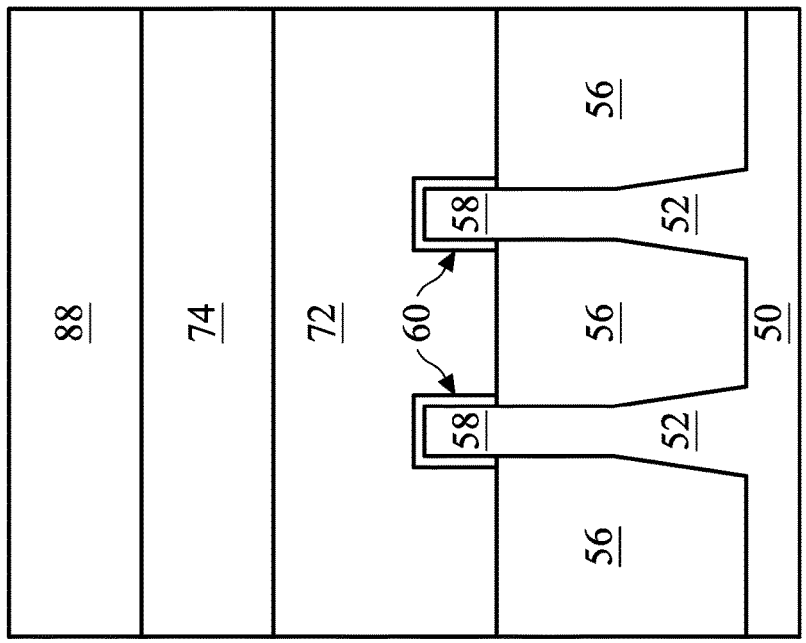

In FIGS. 11A and 11B, an inter-layer dielectric (ILD) 88 is deposited over the structure illustrated in FIGS. 10A and 10B. The ILD 88 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. Other insulation or semiconductor materials formed by any acceptable process may be used. In some embodiments, a contact etch stop layer (CESL), not illustrated, is disposed between the ILD 88 and the epitaxial source/drain regions 82, the masks 74, and the gate spacers 86.

In FIGS. 12A and 12B, a planarization process, such as a CMP, may be performed to level the top surface of the ILD 88 with the top surfaces of the dummy gates 72. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the ILD 88 are level. Accordingly, the top surfaces of the dummy gates 72 are exposed through the ILD 88.

Figure 13B:
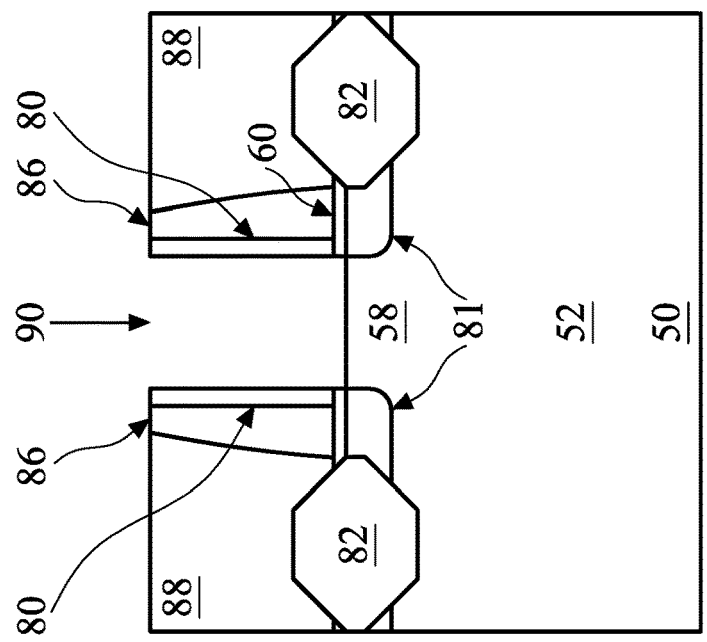
Figure 13A:
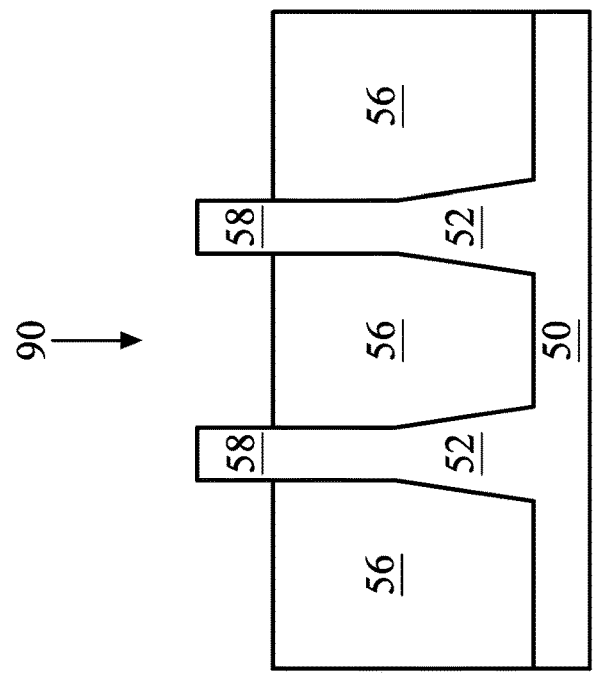

In FIGS. 13A and 13B, the dummy gates 72 and portions of the dummy dielectric layer 60 directly underlying the exposed dummy gates 72 are removed in an etching step(s), so that recesses 90 are formed. In some embodiments, the dummy gates 72 are removed by an anisotropic dry etch process. For example, the etching process may include a dry etch process using reaction gas(es) that selectively etch the dummy gates 72 without etching the ILD 88 or the gate spacers 86. Each recess 90 exposes a channel region of a respective fin 58. Each channel region is disposed between neighboring pairs of the epitaxial source/drain regions 82. During the removal, the dummy dielectric layer 60 may be used as an etch stop layer when the dummy gates 72 are etched. The dummy dielectric layer 60 may then be removed after the removal of the dummy gates 72.

Figure 14B:
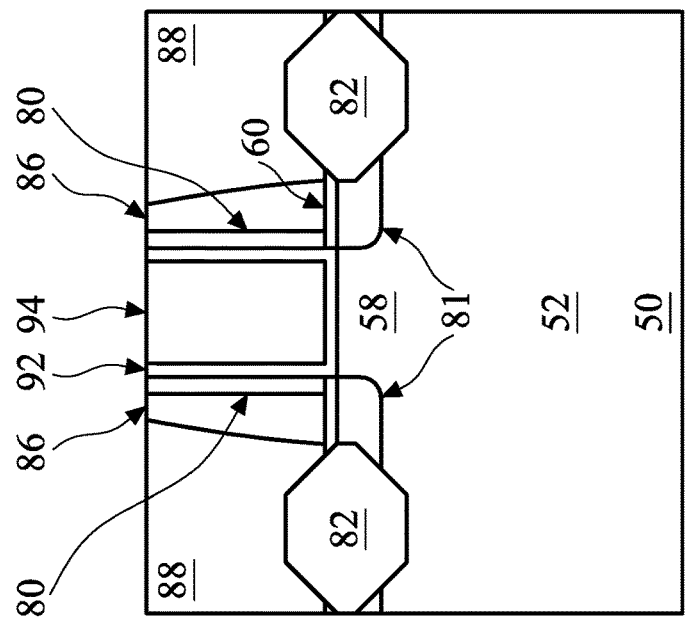
Figure 14A:
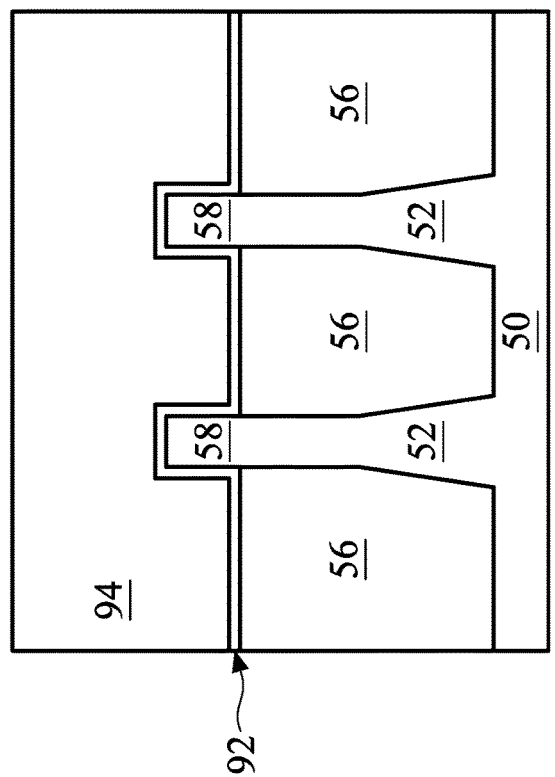

In FIGS. 14A and 14B, gate dielectric layers 92 and gate electrodes 94 are formed for replacement gates. Gate dielectric layers 92 are deposited conformally in the recesses 90, such as on the top surfaces and the sidewalls of the fins 58 and on sidewalls of the gate seal spacers 80/gate spacers 86. The gate dielectric layers 92 may also be formed on top surface of the ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. In embodiments where the gate dielectric layers 92 are a high-k dielectric material, interfacial layers (not shown) may be formed on the fins 58, and the gate dielectric layers 92 may be formed on the interfacial layers. The interfacial layers may be formed of, e.g., SiO2, and may be formed by, e.g., oxidizing the fins 58 in the recesses 90. The formation methods of the gate dielectric layers 92 may include Molecular-Beam Deposition (MBD), atomic layer deposition (ALD), PECVD, and the like.

The gate electrodes 94 are deposited over the gate dielectric layers 92, respectively, and fill the remaining portions of the recesses 90. The gate electrodes 94 may be a metal-containing material such as TiN, TaN, TaC, Co, Ru, Al, combinations thereof, or multi-layers thereof. For example, although a single gate electrode 94 is illustrated, any number of work function tuning layers may be deposited in the recesses 90. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to herein as the "gate" or "gate stack." The gate and the gate stacks may extend along sidewalls of a channel region of the fins 58.

The formation of the gate dielectric layers 92 in the region 50B and the region 50C may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

In FIGS. 15A and 15B, the gate dielectric layers 92 and gate electrodes 94 are recessed in an etching step(s), so that recesses 100 are formed. The etching step(s) may include an anisotropic dry etch. For example, the etching step(s) may include a dry etch process using reaction gas(es) that selectively etch the gate dielectric layers 92 and gate electrodes 94 without etching the ILD 88, gate spacers 86, or gate seal spacers 80.

Figure 16B:
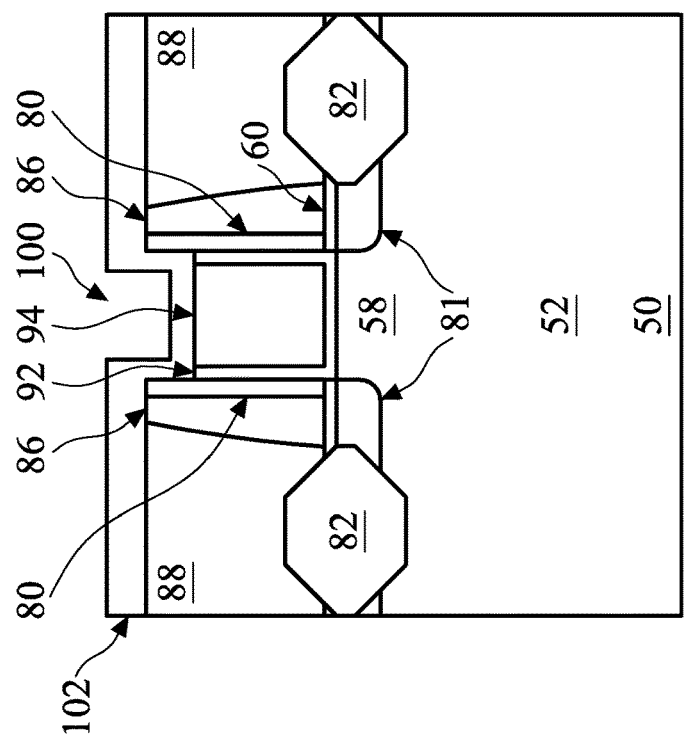
Figure 16A:
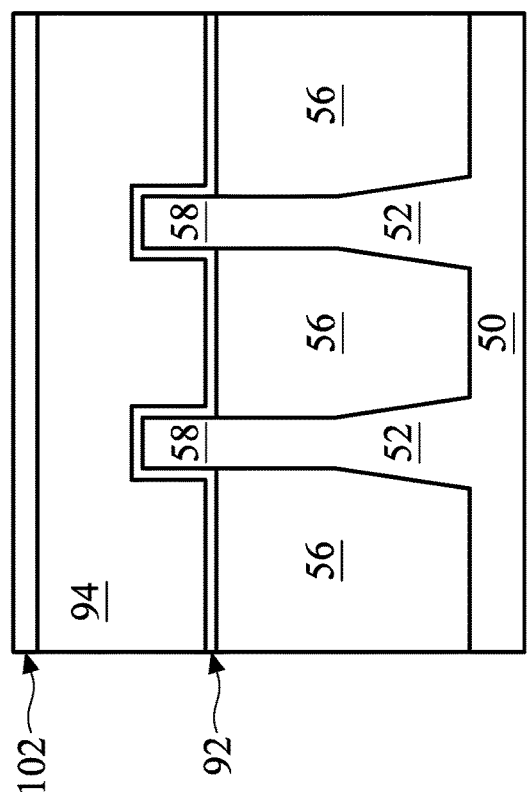

In FIGS. 16A and 16B, a dielectric mask layer 102 is formed in the recesses 100 and along the ILD 88. The dielectric mask layer 102 extends along sides of the recesses 100 (e.g., along the gate seal spacers 80) and along tops of the gate dielectric layers 92 and gate electrodes 94. The dielectric mask layer 102 provides protection for the gate spacers 86 during subsequent self-aligned contact etching steps to ensure that the self-aligned contact does not short one of the gate electrodes 94 to the corresponding epitaxial source/drain regions 82. The dielectric mask layer 102 may be formed from SiN, SiON, $SiO_2$, the like, or a combination thereof, and may be formed by CVD, PVD, ALD, a spin-on-dielectric process, the like, or a combination thereof. In an embodiment, the dielectric mask layer 102 is formed of the same material as the gate spacers 86. The dielectric mask layer 102 is formed to a thickness of from about 20 nm to about 40 nm. In particular, the dielectric mask layer 102 is formed such that it only partially fills recesses 100.

Figures 17A, 17B:
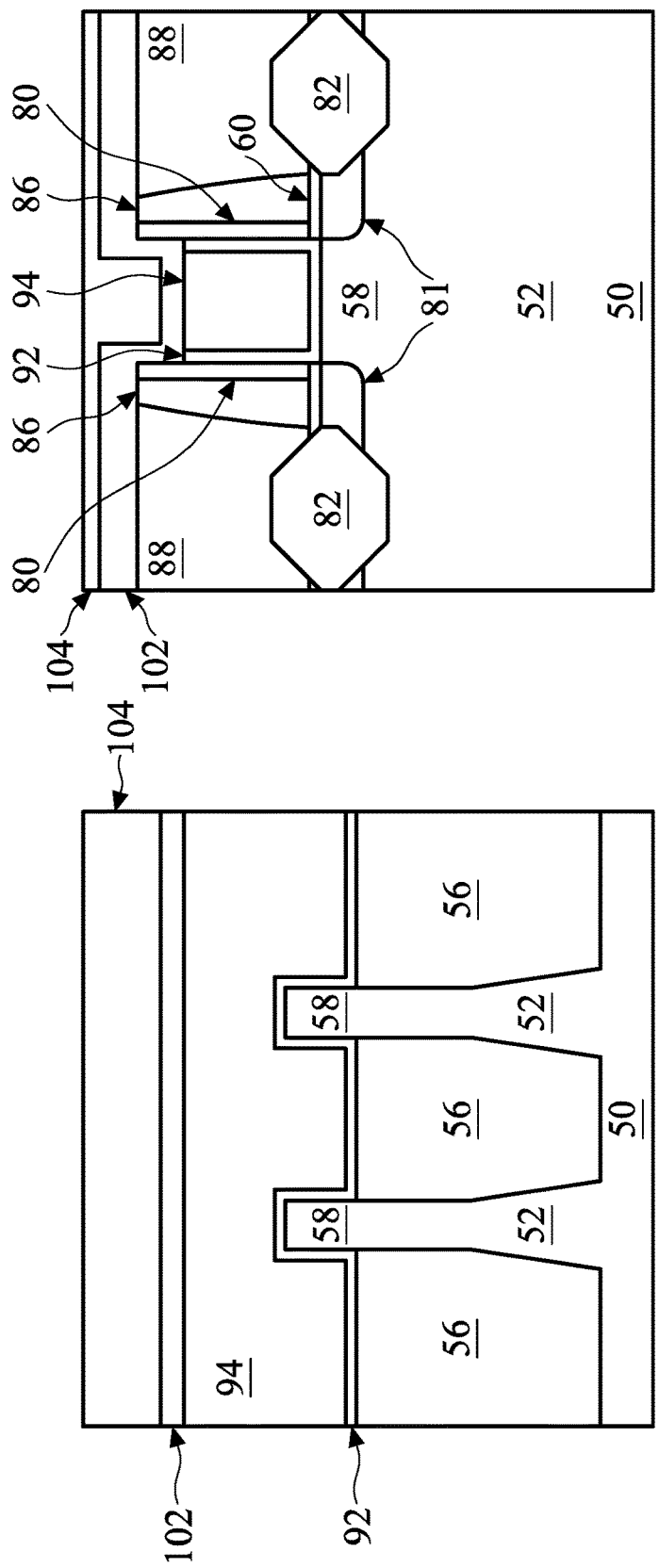

In FIGS. 17A and 17B, a metal mask layer 104 is formed over the dielectric mask layer 102. The metal mask layer 104 fills remaining portions of the recesses 100, and may overfill the recesses 100 such that the metal mask layer 104 extends along top surfaces of the ILD 88. The metal mask layer 104 may be formed from copper, a copper alloy, silver, gold, tungsten, aluminum, nickel, cobalt, the like, or a combination thereof, and may be formed by a deposition process such as electrochemical plating, PVD, CVD, ALD, the like, or a combination thereof.

Because the dielectric mask layer 102 and metal mask layer 104 are different types of materials (e.g., dielectric versus metal), they have high selectivity relative a same planarization process and a same etching process. In particular, the metal mask layer 104 and dielectric mask layer 102 have different removal rates for planarization processes that use the same parameters, such as the same CMP slurry and downward pressure, and also have different removal rates for etching processes that use the same etching parameters, such as the same etchants and temperatures. In an embodiment, both the planarization selectivity and etching selectivity (e.g., ratio of removal rates) of the metal mask layer 104 and dielectric mask layer 102 may be greater than or equal to about 100.

Figures 18A, 18B:
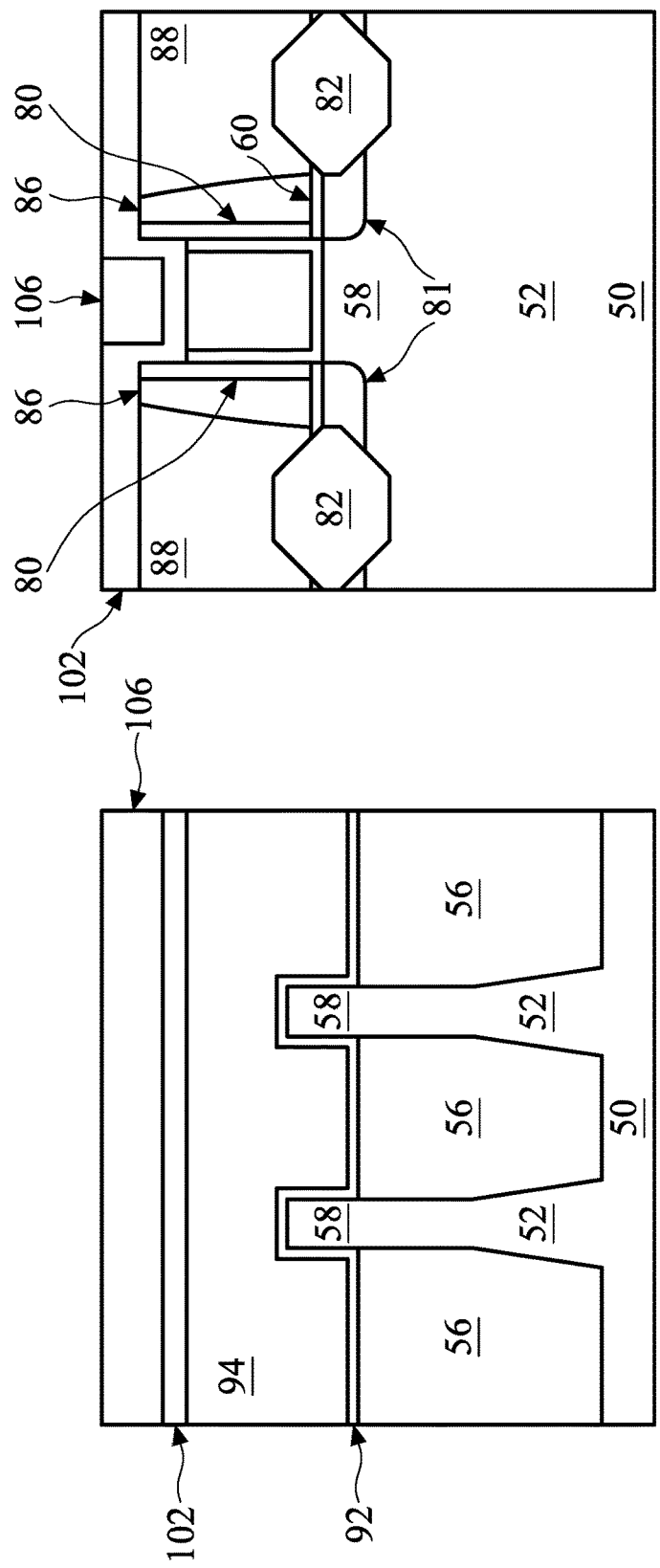

In FIGS. 18A and 18B, a planarization process such as a CMP is performed to remove excess portions of the metal mask layer 104, which excess portions are over the top surface of the dielectric mask layer 102. After the planarization process, portions of the metal mask layer 104 remaining in the recesses 100 form metal masks 106. The top surfaces of the metal masks 106 are level with top surfaces of the dielectric mask layer 102.

Due to the high planarization selectivity of the metal mask layer 104 and dielectric mask layer 102, the dielectric mask layer 102 acts as a planarization stop layer, where the removal rate for the planarization process stops or is substantially decreases when the planarization process encounters the dielectric mask layer 102. Because the dielectric mask layer 102 is over the gate stacks, the gate stacks are therefore not subjected to the planarization process, and heights of the gate stacks before the planarization process are substantially equal to heights of the gate stacks after the planarization process.

Figure 19B:
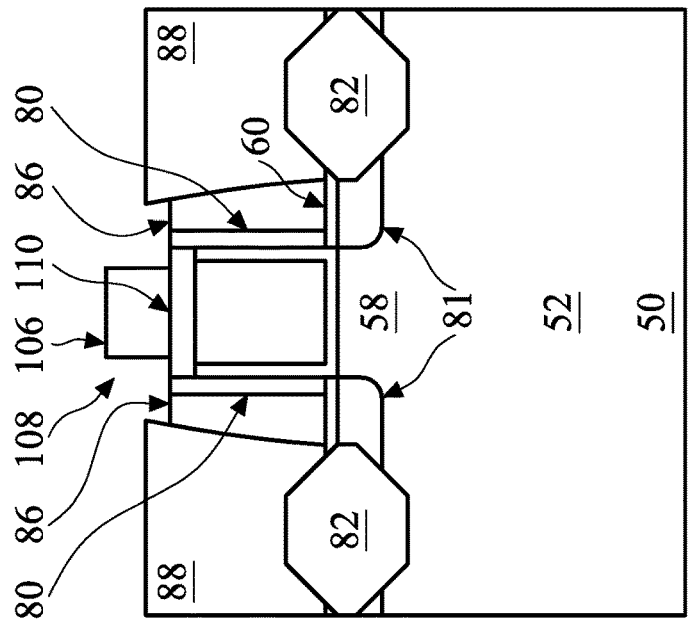
Figure 19A:
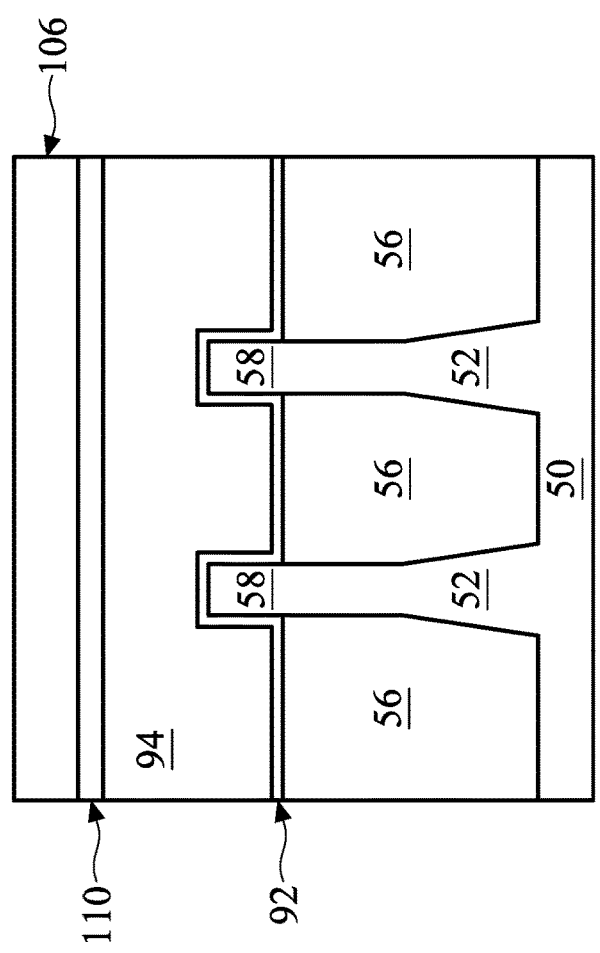

In FIGS. 19A and 19B, an etching process is performed to etch back the dielectric mask layer 102. The etching process is selective to the dielectric material of the dielectric mask layer 102 and the gate spacers 86. For example, an etch process may include the formation of a reactive species from an etchant gas using a plasma. In some embodiments, the plasma may be a remote plasma. The etchant gas may include a fluorocarbon chemistry such as $C_4F_6/CF_4/C_5F$ and $NF_3/O_2/N_2/Ar/H_3/H_2$, the like, or a combination thereof. The etching process removes portions of the dielectric mask layer 102 over the ILD 88, and may also recess the gate spacers 86, gate seal spacers 80, and vertical portions of the dielectric mask layer 102, thereby forming recesses 108 along the metal masks 106. Remaining portions of the dielectric mask layer 102 at the bottom of the recesses 108 form dielectric masks 110 over the gate stacks. Because the metal masks 106 may partially or fully cover the gate stack, the removal rate for the etching process may stop or be substantially decreased proximate the gate stack. As such, the metal masks 106 may protect the gate stack during the etching process such that the heights of the gate stacks before the etching process are substantially equal to heights of the gate stacks after the etching process.

Figures 20A, 20B:
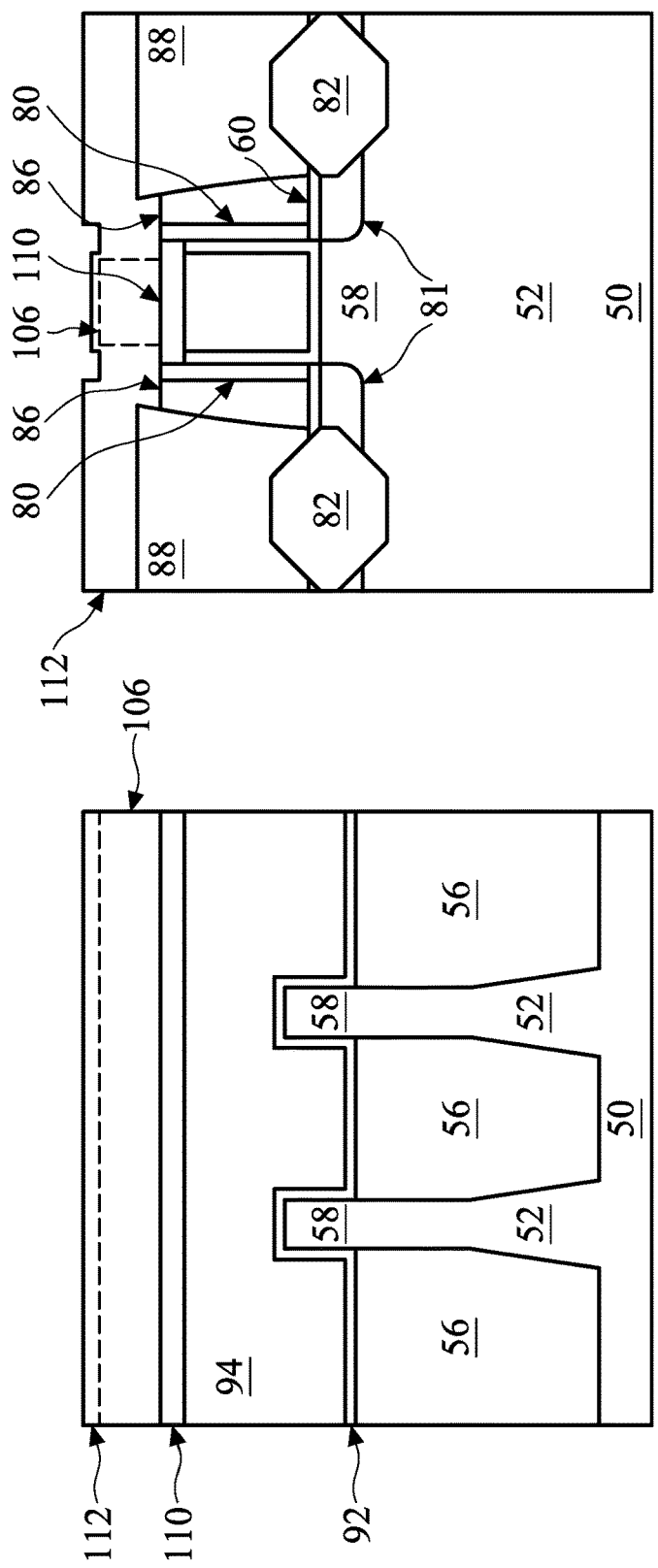

In FIGS. 20A and 20B, a metal mask layer 112 is formed in the recesses 108. The metal mask layer 112 fills the recesses 108, and may overfill the recesses 108 such that the metal mask layer 112 extends along top surfaces of the ILD 88 and over the metal masks 106. The metal mask layer 112 may be formed of a material selected from the same candidate material of the metal mask layer 104, and may be formed using a method that is selected from the same group of candidate methods for forming the metal mask layer 104. The metal mask layers 104 and 112 may be formed of the same material, or may include different materials. In an embodiment, the metal mask layers 104 and 112 include cobalt and are formed using ALD.

Because the ILD 88 and metal mask layer 112 are different types of materials (e.g., dielectric versus metal), they have high selectivity relative a same planarization process and a same etching process. In particular, the metal mask layer 112 and ILD 88 have different removal rates for planarization processes that use the same parameters, such as the same CMP slurry and downward pressure, and also have different removal rates for etching processes that use the same etching parameters, such as the same etchants and temperatures. In an embodiment, both the planarization selectivity and etching selectivity (e.g., ratio of removal rates) of the metal mask layer 112 and ILD 88 may be greater than or equal to about 100.

In FIGS. 21A and 21B, a planarization process is performed to remove excess portions of the metal mask layer 112, which excess portions are over the top surface of the ILD 88. After the planarization process, portions of the metal mask layer 112 and metal masks 106 remain over the gate seal spacers 80, gate spacers 86, gate dielectric layers 92, and gate electrodes 94, thereby forming metal masks 114. The top surfaces of the metal masks 114 are level with top surfaces of the ILD 88.

Due to the high planarization selectivity of the metal mask layer 112 and ILD 88, the ILD 88 acts as a planarization stop layer, where the removal rate for the planarization process stops or is substantially decreases when the planarization process encounters the ILD 88. Because the dielectric masks 110 are over the gate stacks, the gate stacks are therefore not subjected to the planarization process, and heights of the gate stacks before the planarization process are substantially equal to heights of the gate stacks after the planarization process.

The metal masks 114 are formed over both the dielectric masks 110 as well as the gate spacers 86 and gate seal spacers 80. As such, the metal masks 114 and dielectric masks 110 protect the gate structure such that subsequent etching or planarization processes do not reduce the height of the gate stack or spacers. According to some embodiments, the etching process used to etch back the dielectric mask layer 102 may define the height of the gate stack and spacers, and no subsequent processes may reduce the height. Because a single process is used to define the height of the gate stack and spacers (instead of multiple planarization and etching processes), the gate height loss window may be opened, and loss of the gate height may be reduced. Avoiding gate height loss may become important as device sizes continue scaling down, and may help improve mobility of resulting devices.

In FIGS. 22A and 22B, an etching process is performed to remove portions of the ILD 88 to form recesses 116. The recesses 116 expose the epitaxial source/drain regions 82 where replacement contacts are later formed. The etching is selective to the material of the ILD 88, and does not remove the gate spacers 86. For example, an etch process may include the formation of a reactive species from an etchant gas using a plasma. In some embodiments, the plasma may be a remote plasma. The etchant gas may include a fluorocarbon chemistry such as $C_4F_6/CF_4/C_5F$ and $NF_3/O_2/N_2/Ar/$ H₃/H₂, the like, or a combination thereof. A photoresist (not shown) may be formed over the substrate 50, and patterned to expose portions of the ILD 88 that will be replaced with the replacement contacts. The etching process removes exposed portions of the ILD 88. The metal masks 114 protect the gate stacks during the etching process such that the heights of the gate stacks before the etching process are substantially equal to heights of the gate stacks after the etching process.

Figure 23B:
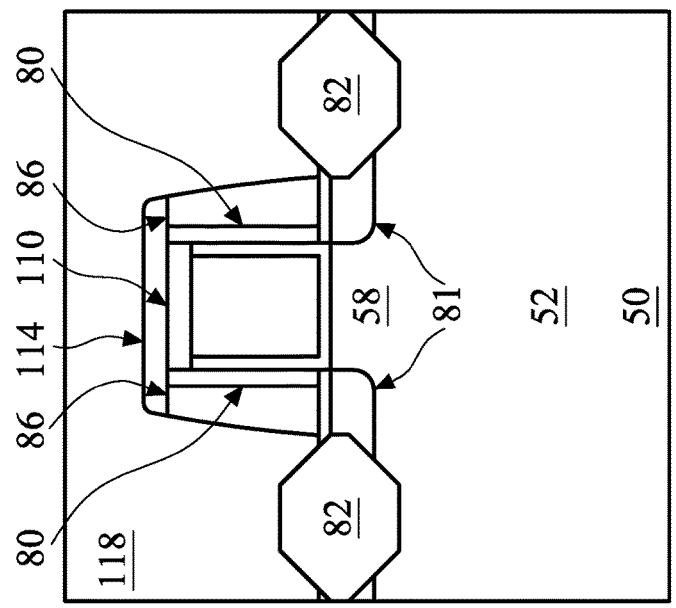
Figure 23A:
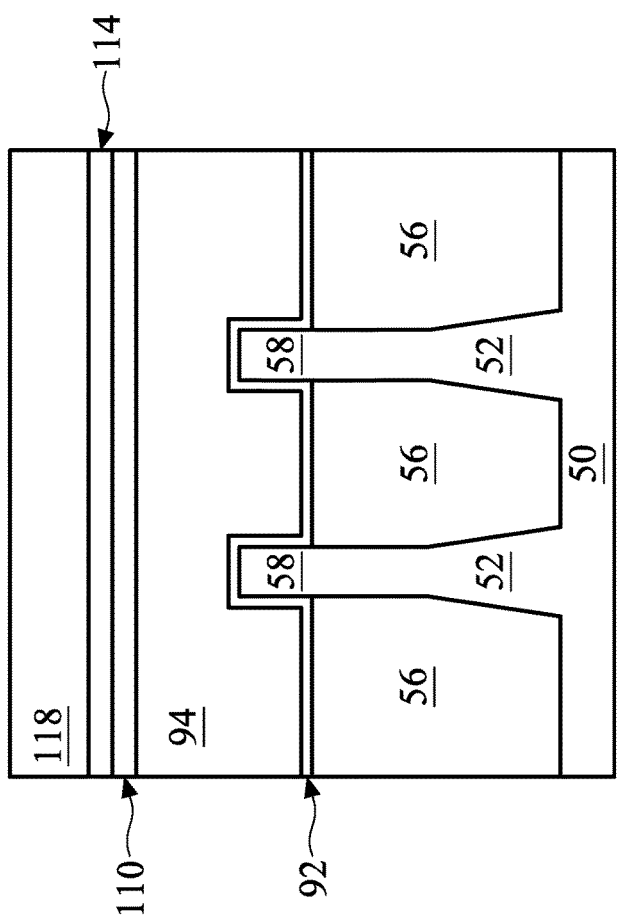

In FIGS. 23A and 23B, a conductive material 118 is formed in the recesses 116. In some embodiments, a liner (not shown) may be formed in the recesses 116 before the conductive material 118 is formed. The liner may include titanium, titanium nitride, tantalum, tantalum nitride, or the like. The conductive material 118 is formed over the liner. The conductive material 118 may be formed of a material selected from the same candidate material of the metal mask layer 104, and may be formed using a method that is selected from the same group of candidate methods for forming the metal mask layer 104. The metal mask layers 104 and 112 may be formed of the same material, or may include different materials. Excess conductive material 118 may also be formed over the gate stack (e.g., over the dielectric masks 110 and metal masks 114).

Because the ILD 88 and dielectric masks 110 are a different type of material then the conductive material 118 and metal masks 114 (e.g., dielectric versus metal), they have high selectivity relative a same planarization process and a same etching process. In particular, the conductive material 118/metal masks 114 have different removal rates than the ILD 88/dielectric masks 110 for planarization processes that use the same parameters, such as the same CMP slurry and downward pressure, and also have different removal rates for etching processes that use the same etching parameters, such as the same etchants and temperatures. In an embodiment, both the planarization selectivity and etching selectivity (e.g., ratio of removal rates) of the metal mask layer 112/metal masks 114 and the ILD 88/dielectric masks 110 may be greater than or equal to about 100.

Figure 24B:
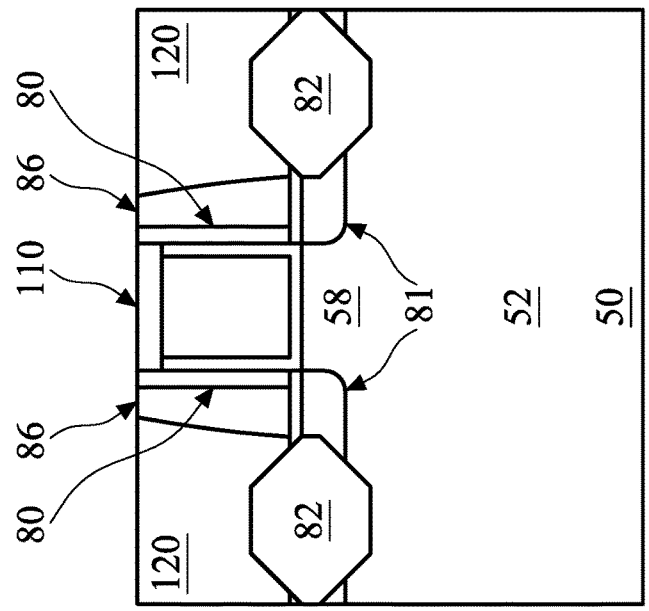
Figure 24A:
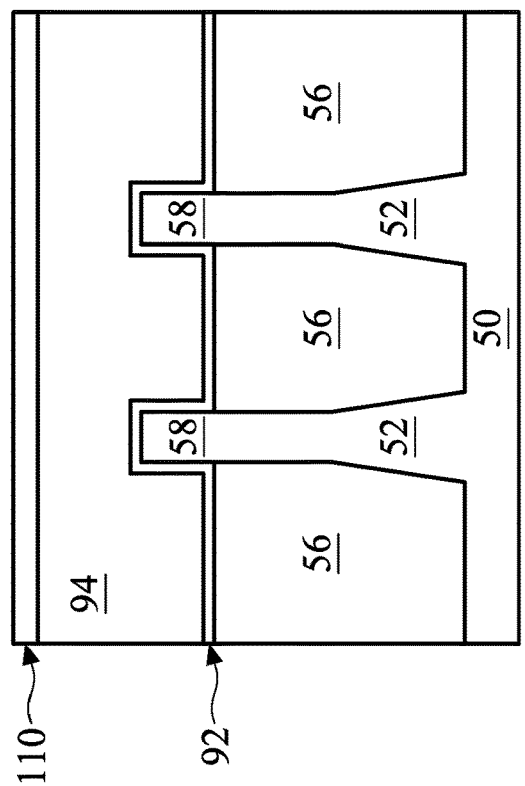

In FIGS. 24A and 24B, a planarization process is performed to remove excess portions of the conductive material 118, which excess portions are over the gate stack (e.g., over the dielectric masks 110 and metal masks 114). The planarization process may be continued until the metal masks 114 are removed. Remaining portions of the conductive material 118 in the recesses 116 forms contacts 120, which are physically and electrically coupled to the epitaxial source/drain regions 82. After the planarization process, top surfaces of the dielectric masks 110, gate spacers 86, gate seal spacers 80, and contacts 120 are level.

Due to the high planarization selectivity of the conductive material 118 and metal masks 114 relative the ILD 88 and dielectric masks 110, the ILD 88 and dielectric masks 110 act as planarization stop layers, where the removal rate for the planarization process stops or is substantially decreases when the planarization process encounters the ILD 88 and dielectric masks 110. Because the dielectric masks 110 are over the gate stacks, the gate stacks are therefore not subjected to the planarization process, and heights of the gate stacks before the planarization process are substantially equal to heights of the gate stacks after the planarization process.

Figure 25B:
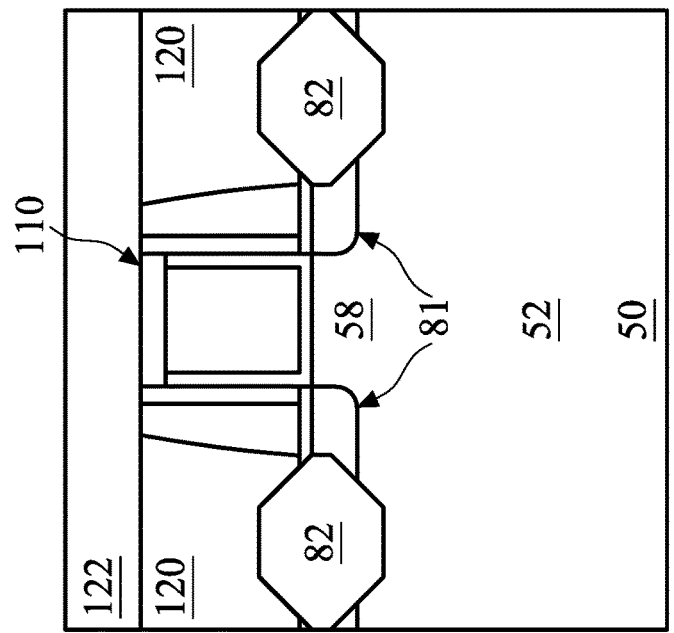
Figure 25A:
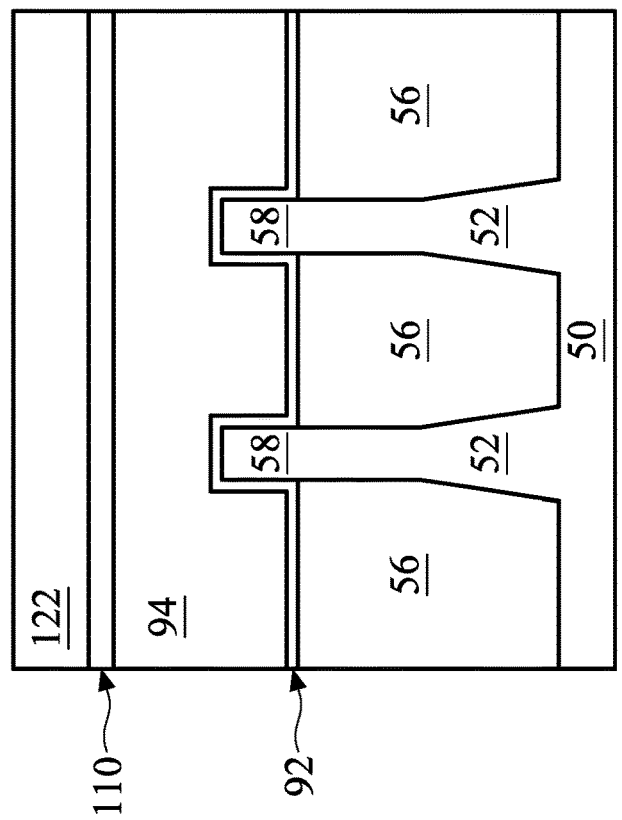

In FIGS. 25A and 25B, an ILD 122 is formed over the gate stack, the contacts 120, the gate spacers 86, the gate seal spacers 80, and the dielectric masks 110. In an embodiment, the ILD 122 is a flowable film formed by a flowable CVD method. In some embodiments, the ILD 122 is formed of a dielectric material such as PSG, BSG, BPSG, USG, or the like, and may be deposited by any suitable method, such as CVD and PECVD.

Figures 26A, 26B:
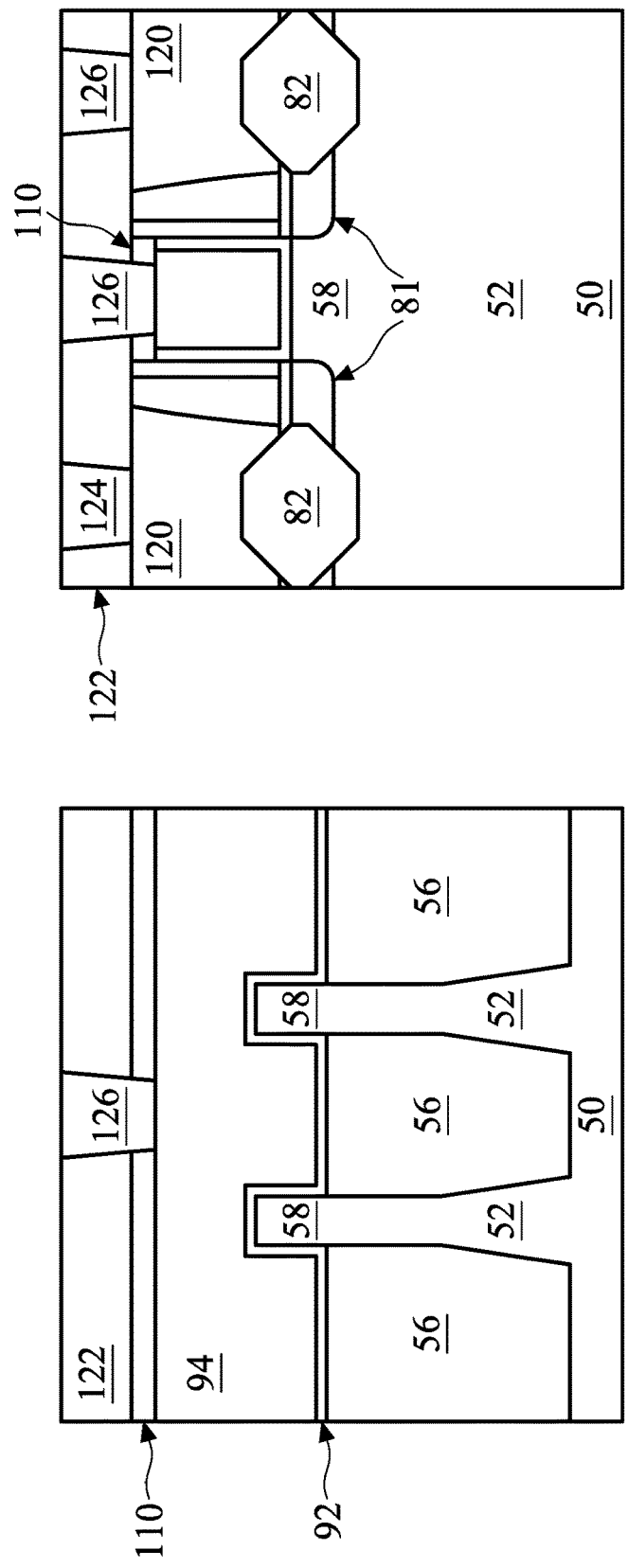

In FIGS. 26A and 26B, contacts 124 and 126 are formed through the ILD 122 and the dielectric masks 110. Openings for the contacts 124 are formed through the ILD 122, and openings for the contacts 126 are formed through the ILD 122 and the dielectric masks 110. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 122. The remaining liner and conductive material form the contacts 124 and 126 in the openings. An anneal process may be performed to form a silicide at the interface between the epitaxial source/drain regions 82 and the contacts 124. The contacts 124 are physically and electrically coupled to the contacts 120, and the contacts 126 are physically and electrically coupled to the gate electrodes 94. The contacts 124 and 126 may be formed in different processes, or may be formed in the same process. Although shown as being formed in the same cross-sections, it should be appreciated that each of the contacts 124 and 126 may be formed in different cross-sections, which may avoid shorting of the contacts 124 and 126.

Embodiments may achieve advantages. Forming dielectric layers and metal layers for planarization and etch stopping layers at various steps of processing may help avoid gate height loss in planarization processes used for forming the contacts 120. In particular, the ILD 88 acts as a planarization stop layer when forming the metal masks 114, the metal masks 114 act as an etching mask when removing the ILD 88, and the dielectric masks 110 act as a planarization stop layer when forming the contacts 120. As such, the height of the gate stack and spacers may be defined during formation of the dielectric masks 110. Gate height loss in subsequent processing steps may thus be avoided, thereby increasing the mobility of resulting devices.

In an embodiment, a method includes: forming a gate stack on a semiconductor fin, the gate stack having gate spacers along opposing sides of the gate stack; forming source/drain regions adjacent the gate stack; recessing the gate stack to form a first recess between the gate spacers; depositing a dielectric layer over the gate stack in the first recess; forming a first metal mask over the dielectric layer and the gate stack in the first recess; etching back the dielectric layer and the gate spacers to form a dielectric mask under the first metal mask; depositing a conductive material over the first metal mask and adjacent the gate stack; and planarizing the conductive material to form contacts electrically connected to the source/drain regions, top surfaces of the contacts and the dielectric mask being level.

In some embodiments, the forming the first metal mask includes: forming a first metal layer over the dielectric layer in the first recess; and planarizing the first metal layer until the first metal mask remains in the first recess, top surfaces of the first metal mask and the dielectric layer being level. In some embodiments: the dielectric layer and the first metal layer have a planarization selectivity greater than 100 relative a same planarization process; and the dielectric layer and the first metal layer have an etching selectivity greater than 100 relative a same etching process. In some embodiments, the method further includes: depositing an inter-layer dielectric (ILD), the ILD being along sides of the gate spacers. In some embodiments, after the etching back the dielectric layer, top surfaces of the ILD are disposed above a top surface of the dielectric mask. In some embodiments, after the forming the first metal mask, top surfaces of the ILD are disposed below a top surface of the first metal mask. In some embodiments, the etching back the dielectric layer and the gate spacers forms second recesses extending along the first metal mask. In some embodiments, the method further includes: forming a second metal layer over the dielectric layer in the second recesses and over the first metal mask; and planarizing the second metal layer until top surfaces of the second metal layer and the ILD are level, where the first metal mask and the second metal layer remaining in the second recesses form a second metal mask. In some embodiments, planarizing the conductive material includes planarizing the conductive material until the second metal mask is removed. In some embodiments, the ILD and the second metal layer have a planarization selectivity greater than 100 relative a same planarization process.

In an embodiment, A method including: forming a gate stack on a semiconductor fin, the gate stack having gate spacers along opposing sides of the gate stack; depositing an inter-layer dielectric (ILD) along sides of the gate spacers; recessing the gate stack to form a recess between the gate spacers; depositing a dielectric layer over the gate stack in a first portion of the recess; depositing a first metal layer over the dielectric layer in a second portion of the recess; planarizing the first metal layer until a first metal mask remains in the recess, top surfaces of the first metal mask and the dielectric layer being level; etching back the dielectric layer until a dielectric mask remains over the gate stack and under the first metal mask; etching a first opening through the ILD; filling the first opening with a conductive material; and planarizing the conductive material until the top surfaces of the dielectric mask and the conductive material are level.

In some embodiments, the etching back the dielectric layer recesses the gate spacers and the dielectric layer to form a second recess around the first metal mask. In some embodiments, the method further includes: depositing a second metal layer over the first metal mask and the dielectric mask; and planarizing the second metal layer until a second metal mask remains in the second recess, top surfaces of the second metal mask and the ILD being level. In some embodiments: the first metal layer and the dielectric layer have a planarization selectivity greater than 100 relative the process for planarizing the first metal layer; the second metal layer and the ILD have a planarization selectivity greater than 100 relative the process for planarizing the second metal layer; and the ILD and the second metal mask have an etching selectivity greater than 100 relative the process for etching the first opening through the ILD. In some embodiments, the first metal layer includes tungsten. In some embodiments, the gate spacers and the dielectric layer include the same dielectric material.

In an embodiment, A method including: forming a gate stack on a semiconductor fin, the gate stack having gate spacers along opposing sides of the gate stack; depositing an inter-layer dielectric (ILD) along sides of the gate spacers; recessing the gate stack to form a recess between the gate spacers; depositing a dielectric layer over the gate stack in a first portion of the recess; depositing a first metal layer over the dielectric layer in a second portion of the recess; planarizing the first metal layer until a first metal mask remains in the recess, top surfaces of the first metal mask and the dielectric layer being level; etching back the dielectric layer and the gate spacers to form a dielectric mask under the first metal mask; depositing a second metal layer over the dielectric mask and the first metal mask; planarizing the second metal layer until a second metal mask remains over the dielectric mask and the gate spacers; depositing a conductive material over the second metal mask and adjacent the gate stack; and planarizing the conductive material such that top surfaces of the conductive material and the dielectric mask are level.

In some embodiments, the dielectric layer is a planarization stop layer during the planarizing the first metal layer. In some embodiments, the ILD is a planarization stop layer during the planarizing the second metal layer. In some embodiments, the dielectric mask is a planarization stop layer during the planarizing the conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate stack on a semiconductor fin, the gate stack having gate spacers along opposing sides of the gate stack;
   forming source/drain regions adjacent the gate stack;
   recessing the gate stack to form a first recess between the gate spacers;
   depositing a dielectric layer over the gate stack in the first recess;
   forming a first metal mask over the dielectric layer and the gate stack in the first recess;
   etching back the dielectric layer and the gate spacers to form a dielectric mask under the first metal mask;
   depositing a conductive material over the first metal mask and adjacent the gate stack; and
   planarizing the conductive material to form contacts electrically connected to the source/drain regions, top surfaces of the contacts and the dielectric mask being level.

2. The method of claim 1, wherein the forming the first metal mask comprises:
   forming a first metal layer over the dielectric layer in the first recess; and
   planarizing the first metal layer until the first metal mask remains in the first recess, top surfaces of the first metal mask and the dielectric layer being level.

3. The method of claim 2, wherein:
   the dielectric layer and the first metal layer have a planarization selectivity greater than 100 relative a same planarization process; and
   the dielectric layer and the first metal layer have an etching selectivity greater than 100 relative a same etching process.

4. The method of claim 1, further comprising:
   depositing an inter-layer dielectric (ILD), the ILD being along sides of the gate spacers.

5. The method of claim 4, wherein after the etching back the dielectric layer, top surfaces of the ILD are disposed above a top surface of the dielectric mask.

6. The method of claim 4, wherein after the forming the first metal mask, top surfaces of the ILD are disposed below a top surface of the first metal mask.

7. The method of claim 4, wherein the etching back the dielectric layer and the gate spacers forms second recesses extending along the first metal mask.

8. The method of claim 7, further comprising:
forming a second metal layer over the dielectric layer in the second recesses and over the first metal mask; and
planarizing the second metal layer until top surfaces of the second metal layer and the ILD are level, wherein the first metal mask and the second metal layer remaining in the second recesses form a second metal mask.

9. The method of claim 8, wherein planarizing the conductive material comprises planarizing the conductive material until the second metal mask is removed.

10. The method of claim 8, wherein the ILD and the second metal layer have a planarization selectivity greater than 100 relative a same planarization process.

11. A method comprising:
forming a gate stack on a semiconductor fin, the gate stack having gate spacers along opposing sides of the gate stack;
depositing an inter-layer dielectric (ILD) along sides of the gate spacers;
recessing the gate stack to form a recess between the gate spacers;
depositing a dielectric layer over the gate stack in a first portion of the recess;
depositing a first metal layer over the dielectric layer in a second portion of the recess;
planarizing the first metal layer until a first metal mask remains in the recess, top surfaces of the first metal mask and the dielectric layer being level;
etching back the dielectric layer until a dielectric mask remains over the gate stack and under the first metal mask;
etching a first opening through the ILD;
filling the first opening with a conductive material; and
planarizing the conductive material until the top surfaces of the dielectric mask and the conductive material are level.

12. The method of claim 11, wherein the etching back the dielectric layer recesses the gate spacers and the dielectric layer to form a second recess around the first metal mask.

13. The method of claim 12, further comprising:
depositing a second metal layer over the first metal mask and the dielectric mask; and
planarizing the second metal layer until a second metal mask remains in the second recess, top surfaces of the second metal mask and the ILD being level.

14. The method of claim 13, wherein:
the first metal layer and the dielectric layer have a planarization selectivity greater than 100 relative the process for planarizing the first metal layer;
the second metal layer and the ILD have a planarization selectivity greater than 100 relative the process for planarizing the second metal layer; and
the ILD and the second metal mask have an etching selectivity greater than 100 relative the process for etching the first opening through the ILD.

15. The method of claim 11, wherein the first metal layer comprises tungsten.

16. The method of claim 11, wherein the gate spacers and the dielectric layer comprise the same dielectric material.

17. A method comprising:
forming a gate stack on a semiconductor fin, the gate stack having gate spacers along opposing sides of the gate stack;
depositing an inter-layer dielectric (ILD) along sides of the gate spacers;
recessing the gate stack to form a recess between the gate spacers;
depositing a dielectric layer over the gate stack in a first portion of the recess;
depositing a first metal layer over the dielectric layer in a second portion of the recess;
planarizing the first metal layer until a first metal mask remains in the recess, top surfaces of the first metal mask and the dielectric layer being level;
etching back the dielectric layer and the gate spacers to form a dielectric mask under the first metal mask;
depositing a second metal layer over the dielectric mask and the first metal mask;
planarizing the second metal layer until a second metal mask remains over the dielectric mask and the gate spacers;
depositing a conductive material over the second metal mask and adjacent the gate stack; and
planarizing the conductive material such that top surfaces of the conductive material and the dielectric mask are level.

18. The method of claim 17, wherein the dielectric layer is a planarization stop layer during the planarizing the first metal layer.

19. The method of claim 17, wherein the ILD is a planarization stop layer during the planarizing the second metal layer.

20. The method of claim 17, wherein the dielectric mask is a planarization stop layer during the planarizing the conductive material.

* * * * *